(12) United States Patent
Yang

(10) Patent No.: US 12,050,496 B2
(45) Date of Patent: Jul. 30, 2024

(54) SERVER

(71) Applicant: CMOTION TECHNOLOGIES LIMITED, Hongkong (CN)

(72) Inventor: Bin Yang, Beijing (CN)

(73) Assignee: CMOTION TECHNOLOGIES LIMITED, Hongkong (CN)

( * ) Notice: Subject to any disclaimer, the term of this patent is extended or adjusted under 35 U.S.C. 154(b) by 431 days.

(21) Appl. No.: 17/398,008

(22) Filed: Aug. 10, 2021

(65) Prior Publication Data

US 2022/0043494 A1 Feb. 10, 2022

(30) Foreign Application Priority Data

Aug. 10, 2020 (CN) .......................... 202010795717.5
Aug. 10, 2020 (CN) .......................... 202021648731.4

(51) Int. Cl.
| | |
|---|---|
| *G06F 1/26* | (2006.01) |
| *G06F 1/18* | (2006.01) |
| *G06F 1/20* | (2006.01) |
| *H05K 7/14* | (2006.01) |
| *H05K 7/20* | (2006.01) |

(52) U.S. Cl.
CPC ................ *G06F 1/26* (2013.01); *G06F 1/181* (2013.01); *G06F 1/183* (2013.01); *G06F 1/189* (2013.01); *G06F 1/20* (2013.01); *H05K 7/1492* (2013.01); *H05K 7/20818* (2013.01); *G06F 2200/201* (2013.01)

(58) Field of Classification Search
CPC .......... G06F 1/181; G06F 1/183; G06F 1/186; G06F 1/188; G06F 1/189; G06F 1/20; G06F 1/26; G06F 2200/201; H05K 7/1492; H05K 7/20772; H05K 7/20809; H05K 7/20818

See application file for complete search history.

(56) References Cited

U.S. PATENT DOCUMENTS

| | | | | |
|---|---|---|---|---|
| 2008/0309160 | A1* | 12/2008 | Gibson ................... | H01R 31/02 307/11 |
| 2013/0111098 | A1* | 5/2013 | Li .......................... | H05K 7/1492 361/752 |
| 2017/0181311 | A1* | 6/2017 | Fang ..................... | H05K 7/1487 |
| 2021/0124406 | A1* | 4/2021 | Ma .......................... | H02M 1/32 |
| 2022/0046820 | A1* | 2/2022 | Yang ....................... | G06F 1/181 |

FOREIGN PATENT DOCUMENTS

EP 1466511 B1 * 10/2017 ............... H05K 7/14

* cited by examiner

*Primary Examiner* — Terrell S Johnson
(74) *Attorney, Agent, or Firm* — Andrew C. Cheng

(57) ABSTRACT

The disclosure discloses a server, which includes a housing, a plurality of hash boards, a control module, a power supply module, an electrical connection board and a heat dissipation nodule, wherein a second accommodation space is suitable for assembling a power supply module. A plurality of hash boards are slidably arranged in a first accommodation space of the housing. The control module is slidably arranged in a third accommodation space of the housing, and the power module is slidably arranged in a fourth accommodation space of the housing. The hash board, the power module, the control module and the power supply module are respectively connected with the electrical connection board. The power supply module supplies power to the hash board through the electrical connection board, and the power supply module supplies power to the control module through the electrical connection board.

19 Claims, 23 Drawing Sheets front ← → rear

SERVER

FIELD OF THE INVENTION

The disclosure relates to the field of servers, and particularly to a server.

BACKGROUND

In related technologies, servers generally have multiple modules, such as power modules, hash boards, heat dissipation modules, control modules, and so on. Multiple modules are generally fixedly installed in the housing of server, and cannot be removed or installed separately, which is inconvenient for the disassembly and maintenance of modules. At the same time, the placement of multiple modules is messy, resulting in a server that is not neatly structured. In addition, the power module needs to supply power to multiple hash boards and control modules at the same time. On the one hand this setting has low power supply stability; on the other hand when a power supply failure occurs, the location of the fault cannot be quickly checked. In addition, the disassembly and assembly of multiple modules of the server is complicated and inefficient.

SUMMARY

The disclosure aims to solve at least one of the technical problems existing in the prior art. For this reason, one object of the disclosure is to provide a server with a simple and neat structure, convenient disassembly and assembly, and good stability.

The server according to the embodiment of the disclosure comprises: a housing configured as a frame structure, and configured with at least a first accommodation space, a second accommodation space assembling a power module, a third accommodation space located between the first accommodation space and the second accommodation space and a fourth accommodation space located between the first accommodation space and the second accommodation space;

a plurality of hash boards arranged in the first accommodation space of the housing side by side along a first direction;

a control module slidably arranged in the third accommodation space of the housing;

a power supply module slidably arranged in the fourth accommodation space of the housing;

an electrical connection board arranged in the housing, and being configured to respectively connect to the hash board, the power module, the control module, and the power supply module; and a heat dissipation module at least dissipating heat for the plurality of hash boards;

wherein each of hash boards is arranged perpendicular to the first direction and is slidably arranged in the first accommodation space, and the fourth accommodation space is separated from the third accommodation space in the first direction; the power module supplies power to the hash board through the electric connection board, and the power supply module supplies power to the control module through the electric connection board.

According to the server of the embodiment of the disclosure, by arranging the computing power board, the power module, the control module, and the power supply module are in the first accommodation space, the second accommodation space, the third accommodation space, and the fourth accommodation space separately, the modularization of the server is realized. The server structure is simple and tidy, which is conducive to the disassembly and maintenance of the hash board and multiple modules separately. At the same time, the hash board, the control module, and the power supply module can all be slidably arranged in the housing, so that the modules can be easily disassembled and maintained. In addition, the power module supplies power to the hash board through the electrical connection board, and the power supply module supplies power to the control module through the electrical connection board, which can realize the dual-circuit power supply of the server to improve the stability of the server.

In some embodiments, the server further comprises the power module, which is slidably arranged in the second accommodation space of the housing, and an extension direction of the power module is consistent with that of the hash board.

In some embodiments, to plurality of power modules arranged along the first direction, and each power module is suitable for supplying power to 2-4 hash boards.

In some embodiments, the hash board is provided with a step-down circuit module, wherein the power module is configured to convert a first AC power voltage of a first external AC power to a DC power and supply the DC power to the step-down circuit module, wherein the step-down circuit module reduces a DC power voltage and supplies power to the hash chip on the hash board.

In some embodiments, the first DC power voltage of the DC power converted by the power module is 48V, and a second DC power voltage of the DC power reduced by the step-down circuit module of the hash board is 12V.

In some embodiments, the power supply module converts the second AC power voltage of the external second AC power into a third DC power voltage of 12V to supply power to the control module.

In some embodiments, the value range of the first AC power voltage and the second AC power voltage is 220 v-380 v.

In some embodiments, the control module comprises:

a control board body and a first circuit board arranged at one end of the control board body; the first circuit board is provided with a first control signal interface and a second control signal interface; the first control signal interface is suitable for connecting with a first port of the electrical connection board to realize signal connection, and the second control signal interface is suitable for connecting with a second port of the electrical connection board to transmit the current; and both sides of the third accommodation space are provided with sliding strips, and the control board body is provided with slideways on both sides, wherein the control board body realizes the movement in the third accommodation space by sliding the sliding strips in the slideways.

In some embodiments, the power supply module comprises:

a power supply board body; and a second circuit board arranged at one end of the power supply board body; the second circuit board is provided with a first current interface and a second current interface, wherein the first current interface is suitable for connecting with a third port of the electrical connection board to access the external voltage, and the second current interface is suitable for connecting with a fourth port of the electrical connection board to transmit the current.

In some embodiments, the hash board, the control module and the power supply module are located on one side of the electrical connection board along a second direction, and the second direction is parallel to the extending direction of the hash board.

In some embodiments, the electrical connection board comprises:

a PCB substrate provided with two contact areas respectively connected with positive and negative electrodes of the power supply, and the two sides of each contact area provided with first and second contact surfaces suitable for contacting with the conductor, and each contact area provided with multiple through holes;

a first conductive layer and a second conductive layer respectively arranged on the first and the second contact surfaces;

a third conductive layer arranged in the through hole and electrically connecting the first and second conductive layers;

a first conductive strip fixed to the first conductive layer and electrically connecting with the first conductive layer, wherein the first conductive strip is suitable for connecting the power module;

a second conductive strip connecting to the second conductive layer and electrically connecting with the second conductive layer, wherein the second conductive strip is electrically connected with the hash board.

In some embodiments, the first and second conductive layers are both configured as conductive films plated on the first and second contact surfaces.

In some embodiments, the third conductive layer is configured as a conductive film plated on the side wall of the through hole, or composed of a conductive material passing through the through hole.

In some embodiments, the PCB substrate is also provided with screw holes, and the first conductive strip, the second conductive strip and the PCB substrate are connected by screws, wherein the multiple through holes are arranged around the screw holes, and the diameter ratio of the through holes to the screw holes ranges from 1/10 to 1/100.

In some embodiments, the first conductive strip comprises:

a first conductive sheet connecting with the first conductive layer;

a second conductive sheet connecting with the power module; and a connecting sheet connecting between the first conductive sheet and the second conductive sheet.

In some embodiments, the connecting sheet is L-shaped and vertically connected with the first conductive sheet and the second conductive sheet respectively.

In some embodiments, the electrical connection board further comprises:

two conductive connection boards respectively connecting with the second conductive strips of the two contact areas to connect the positive and negative electrodes of the power supply, wherein each conductive connection board is provided with a plurality of conductive pins, and the conductive pins on the two conductive connecting boards are one-to-one corresponding to form a plurality of pairs of conductive pins, wherein each pair of conductive pins is one-to-one corresponding to each hash board and electrically connected to supply power to the hash board;

an insulating layer arranged between the two conductive connection boards to avoid short circuit between the conductive connection boards connecting the positive and the negative electrodes of the power supply.

In some embodiments, the two conductive connection boards are parallel in the length direction of the PCB substrate, and are separated by a preset gap in the height direction of the PCB substrate, wherein the plurality of conductive pins are arranged evenly at intervals in the length direction of each conductive connection board;

the insulating layer arranged at the positive electrode of the conductive connection board.

In some embodiments, one end of the hash board facing the electrical connection board has a mounting seat which provides a first fitthing part and the conductive pin are detachably matched to the first fitthing part to connect or disconnect the power supply path of the hash board.

In some embodiments, one of a hook or a slot is provided in the mounting seat, and the other of a hook or a slot is provided on the conductive pins, whereby electrical connection between the hash board and the conductive pin is realized by the cooperation of the hook and the slot.

In some embodiments, wherein the mounting seat is provided with a mounting hole, and the inner wall of the mounting hole is provided with a reed protruding towards the axis of the mounting hole, wherein the conductive pin is shaped into a cylinder and is inserted into the mounting hole to be obstructively connected with the reed.

In some embodiments, both ends of the reed are fixed to the inner wall of the mounting hole and the middle part of the reed protrudes toward the axis of the mounting hole.

In some embodiments, one end of the reed is fixed to the inner wall of the mounting hole and the other end is cocked.

In some embodiments, the mounting seat is also provided with a round hole, and the round hole is arranged opposite to the mounting hole, wherein the round hole and the mounting hole pass through the mounting seat, wherein the diameter of the round hole is larger than that of the conductive pin and smaller than that of the mounting hole.

In some embodiments, the hash board comprises:

a hash board body, on which a hash chip is arranged;

a baffle board arranged at one end of the hash board body far away from the electrical connection board, and the baffle board is configured to close the opening of the first accommodation space after the hash board is contained in the first accommodation space; and a handle arranged on the side of the baffle away from the electrical connecting board.

In some embodiments, chutes are arranged in the first accommodation space, and the chutes are distributed at the top and bottom of the first accommodation space, wherein the housing is also formed with an open side connected with the first accommodation space, and the housing is provided with a fixed part at the edge of the open side;

the hash board is slidably arranged on the chutes, the top edge and the bottom edge of the hash board are respectively matched in the chutes at the top and the bottom of the first accommodation space, wherein one end of the hash board is provided with a plug-in part, which is detachably installed on the fixed part and at least partially covers the open side.

In some embodiments, the fixing part comprises a fixing hole at one edge of the open side and a positioning hole at the other edge of the open side, wherein the plug-in part, is fixed at, the fixing hole through a fastener and is provided with a positioning pin, and the positioning pin fits in the positioning hole;

the first accommodation spaces are multiple, and a partition board extending along the first direction is arranged between adjacent first accommodation spaces.

In some embodiments, the hash board body further comprises a heat sink for dissipating heat of the hash chip, and the hash board is provided in the first accommodation space of the housing and slide towards the front side of the housing, wherein the heat dissipation module is arranged at the rear end of the housing and corresponds to the hash board, and the heat dissipation module comprises at least one fan to dissipate heat for the hash board.

In some embodiments, the hash board further comprises a step-down circuit module arranged on the hash board body and separated from the hash chip in a second direction, wherein the second direction is parallel to the extension direction of the hash board;

the heat dissipation module comprising:

at least one first cooling board arranged on the step-down circuit module;

a water cooling board arranged on one side surface of the hash board body;

at least one heat pipe arranged on the hash board body, and one end of the heat pipe is lapped on the first cooling board and the other end is lapped on the water cooling board.

In some embodiments, the first cooling board comprises a plurality of first cooling boards spaced apart on the step-down circuit module, and each first cooling board corresponds to at least one heat pipe.

In some embodiments, the first cooling board comprises one first cooling board, and one end of all the heat pipes are lapped on the first cooling board.

In some embodiments, the server further comprises a second cooling board which is arranged on the surface of the side of the water cooling board away from the hash board body, and the other ends of all the heat pipes are lapped on the second cooling board.

In some embodiments, at least one long slot is provided on at least one of the first cooling board and the second cooling board, and the long slot is suitable for accommodation a part of the heat pipe.

In some embodiments, the first cooling board and the second cooling board are aluminum alloy boards.

In some embodiments, a thermally conductive gel capable of adjusting the height of the first cooling board is provided between the step-down circuit module and the first cooling board.

In some embodiments, each of the heat pipes comprises:

a first heat pipe section lapped on one side of the water cooling board;

a second heat pipe section lapped on one side of the first cooling board, and the distance between the second heat pipe section and the hash hoard body is less than the distance between the first heat pipe section and the hash board body;

a connecting pipe section connected between the first heat pipe section and the second heat pipe section to form a step structure.

In some embodiments, the relationship between the height h of the connecting pipe section and the horizontal length L of the connecting pipe section meets the following requirements:

$$1/20 \leq h/L \leq 1/2.$$

In some embodiments, arc transitions are provided between the first heat pipe section and the connecting pipe section; and between the second heat pipe section and the connecting pipe section, and the radius of the arc is greater than or equal to twice the diameter of the heat pipe.

The additional aspects and advantages of the disclosure will be partly given in the following description, and partly will become obvious from the following description, or be understood through the practice of the disclosure.

BRIEF DESCRIPTION OF THE DRAWINGS

The above and/or additional aspects and advantages of the disclosure will become obvious and easy to understand from the description of the embodiment in combination with the following drawings.

Figure 1:
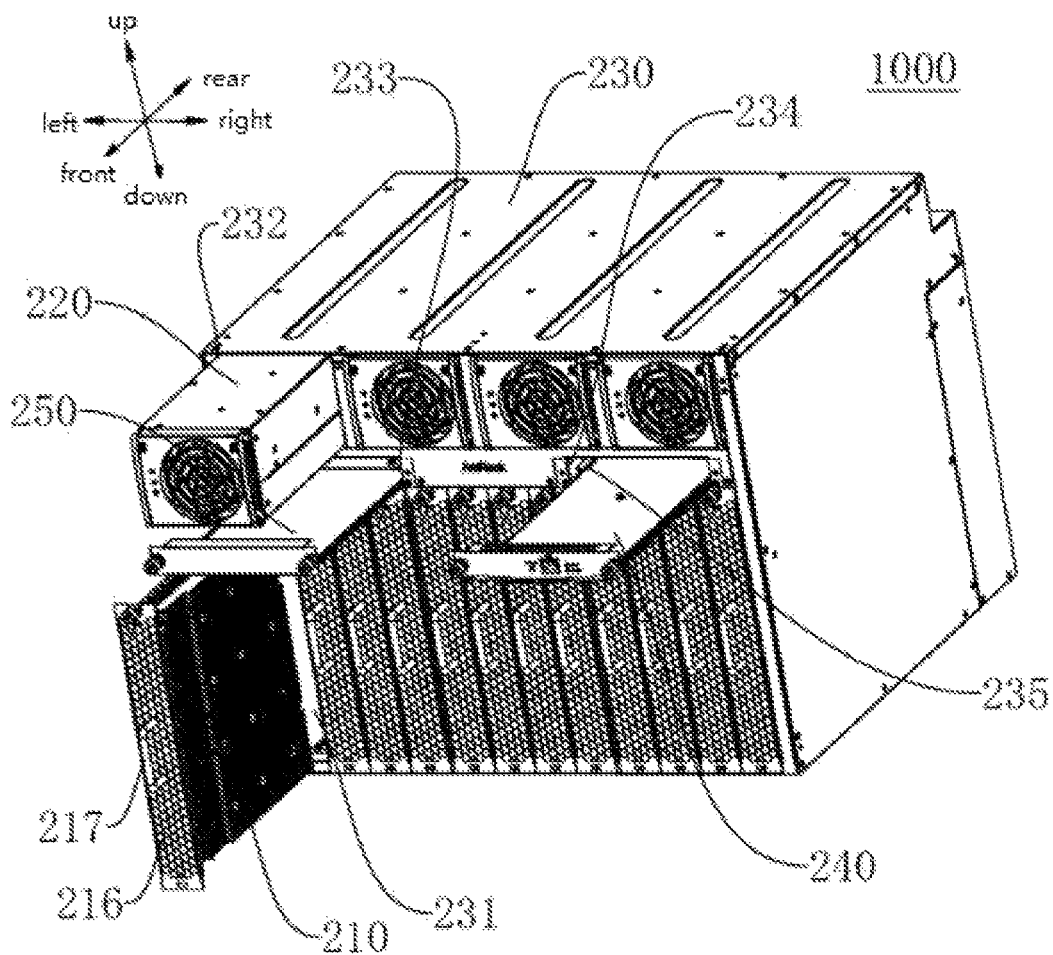
FIG. 1 is a first angle of schematic view of a server according to an embodiment of the disclosure.

NUMERALS IN THE FIGURES server 1000; hash board 210; mounting seat 211; mounting hole 213; reed 214; hash board body 215; baffle 216;

handle 217; hash chip 218; round hole 219; plug-in part 210a; positioning pin 210b; fastener 210c;

power module 220; housing 230; first accommodation space 231; second accommodation space 232; third accommodation space 233; fourth accommodation space 234; sliding strip 235; chute 236; open side 237; fixing part 238; fixing hole 2381; positioning hole 2382; partition 239;

control module 240; control board body 241; slideway 242; first control signal interface 243; guide positioning seat 244; second control signal interface 245; first circuit board 246; power supply module 250; power supply board body 251; first current Interface 252; second current interface 253; second circuit board 254;

heat dissipation module 260; first cooling board 261; water cooling board 262; heat pipe 263; first heat pipe section 264; second heat pipe section 265; connecting pipe section 266; second cooling board 267; long slot 268; fan 269; step-down circuit module 270; Fifth port 280; fastening screw 290;

electrical connection board 100; PCB substrate 10; contact area 11; first contact surface 111; second contact surface 112; through hole 113; screw hole 114; guide positioning post 115; first port 116; second port 117; third port 118; fourth port 119; first conductive layer 20; second conductive layer 30; third conductive layer 40; first conductive strip 50; first conductive sheet 51; second conductive sheet 52; perforation 521; connecting sheet 53; the second conductive strip 60; the conductive connecting board 70; the conductive pin 71; the insulating layer 80.

DETAILED DESCRIPTION

The embodiments of the disclosure are described in detail below with reference to the attached exemplary drawings.

The following describes a server according to an embodiment of the disclosure with reference to FIGS. 1 to 29, including: a housing 230, a plurality of hash boards 210, a control module 240, a power supply module 250, an electrical connection board 100, and a heat dissipation module 260.

Figure 2:
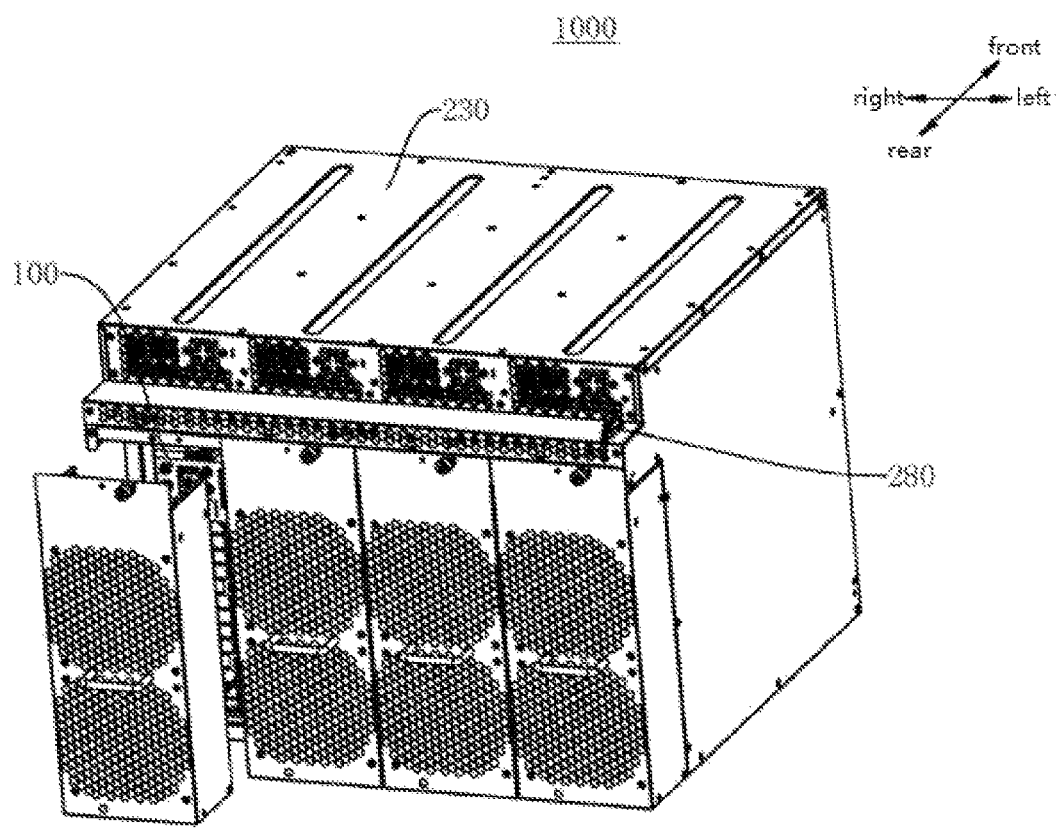
FIG. 2 is a second angle of schematic view of a server according to an embodiment of the disclosure.

As shown in FIGS. 1 and 2, the housing 230 is configured as a frame structure, and the housing 230 is configured with at least a first accommodation space 231; a second accommodation space 232, a third accommodation space 233, and a fourth accommodation space 234, wherein the second accommodation space 232 is suitable for assembling the power module 220.

The plurality of hash boards 210 are arranged side by side in the first accommodation space 231 in the housing 230 along a first direction (for example, the left-right directions as shown in FIG. 1 and FIG. 2). Each of hash boards 210 is arranged perpendicular to the first direction, and slidably arranged in the first accommodation space 231. The disassembly and assembly of the hash board 210 in the housing 230 can be realized by pushing or pulling the hash board 210, which improves the convenience of disassembly and assembly of the hash board 210.

The control module 240 is slidably arranged in the third accommodation space 233 of the housing 230, and the third accommodation space 233 is located between the first accommodation space 231 and the second accommodation space 232. The power supply module 250 is slidably arranged in the fourth accommodation space 234 of the housing 230. The fourth accommodation space 234 is located between the first accommodation space 231 and the second accommodation space 232, and is spaced apart from the third accommodation space 233 in the first direction. The disassembly and assembly in the housing 230 can be realized by pushing or pulling the control module 240 and the power supply module 250, which improves the convenience of assembly and disassembly. The heat dissipation module 260 at least dissipates heat to the plurality of hash boards 210. In this way, the modular configuration of the server 1000 can be realized, and the individual maintenance, disassembly and assembly of multiple modules can be facilitated.

The electrical connection board 100 is provided in the housing 230. The hash board 210, the power module 220, the control module 240, and the power supply module 250 are respectively connected to the electrical connection board 100. The power supply module 220 supplies power to the hash board 210 through the electrical connection board 100. Power supply module 250 supplies power to the control module 240 through the electrical connection board 100. In this way, the dual-circuit power supply of the server 1000 can be realized, and the two circuits do not interfere with each other, thereby improving the stability of the circuit. At the same time, the two circuits can introduce different voltages, and can also provide different voltages to the hash board 210 and the control module 240, which improves the adaptability and can further improve the safety and stability of power supply. In addition, when one of the circuits fails, the other circuit will not be affected, which can prevent the abnormality of one part of the same circuit from causing damage to the other part of the same circuit, and can improve the troubleshooting and maintenance efficiency.

According to the server 1000 of the embodiment of the disclosure, the hash board 210, the power module 220, the control module 240, and the power supply module 250 are respectively arranged in the first accommodation space 231, the second accommodation space 232, the third accommodation space 233, and the fourth accommodation space 234, which realizes the modularization of the server 1000. The structure of the server 1000 is simple and tidy, which facilitates the ability of the hash board 210 and multiple modules to be separately disassembled and maintained. At the same time, the hash board 210, the control module 240, and the power supply module 250 can all be slidably arranged in the housing 230, so that the module can be easily disassembled and repaired. In addition, the power module 220 supplies power to the hash board 210 through the electrical connection board 100, and the power supply module 250 supplies power to the control module 240 through the electrical connection board 100, which can realize the dual-circuit power supply of the server 1000 to improve the stability of the server 1000.

In some embodiments, the server 1000 may include a power module 220, the power module 220 is slidably arranged in the second accommodation space 232 of the housing 230, and the extending direction of the power module 220 is consistent with the extending direction of the hash board 210. The hash board 210, the control module 240, and the power supply module 250 are all located on one side of the electrical connection board 100 in the front-rear direction, and the front-rear direction is parallel to the extending direction of the hash board 210. In this way, the connection between the electrical connection board 100 and the hash board 210, the electrical connection board 100 and the control module 240, and the electrical connection board 100 and the power supply module 250 can be facilitated.

Further, there may be multiple power modules 220 arranged in the left-right direction, and each power module 220 is suitable for supplying power to 2-4 hash boards 210. For example, the server 1000 has 12 hash boards 210 and four power modules 220, and each power module 220 is suitable for supplying power to three hash boards 210, so that the server 1000 has a large computing power.

According to an embodiment of the disclosure, the hash board 210 is provided with a step-down circuit module, and the power module 220 is configured to convert the first AC voltage of the first AC power that is externally connected into DC power and supply the DC power to the step-down circuit module. The circuit module steps down the direct current to supply power to the hash chip on the hash board 210. Through the setting of the step-down circuit module, high voltage can be converted into low voltage, and power can be supplied to the hash chip on the hash board 210, which is convenient to realize the dual-circuit power supply of the server 1000. For example, the step-down circuit module may be provided on the hash board 210.

In some embodiments, the first DC voltage of the DC power converted by the power module 220 is 48V, and the second DC voltage after the DC power is reduced by the step-down circuit module of the hash board 210 is 12V, and then is input to the hash chip on the hash board 210 for power supply.

In some embodiments, the power supply module 250 converts the second. AC voltage of the external second AC power into a third DC voltage of 12V and then supplies power to the control module 240, thereby realizing dual-circuit power supply for the server 1000 and improving circuit stability.

In some embodiments, the range of the first AC voltage and the second AC voltage is 220V-380V, different voltages can be introduced to the two circuits, or different voltages can be provided to the hash board 210 and the control module 240, and safety and stability of power supply can be further improved. For example, the first AC voltage may be 380V or 220V, and the second AC voltage may be 220V.

Figure 4:
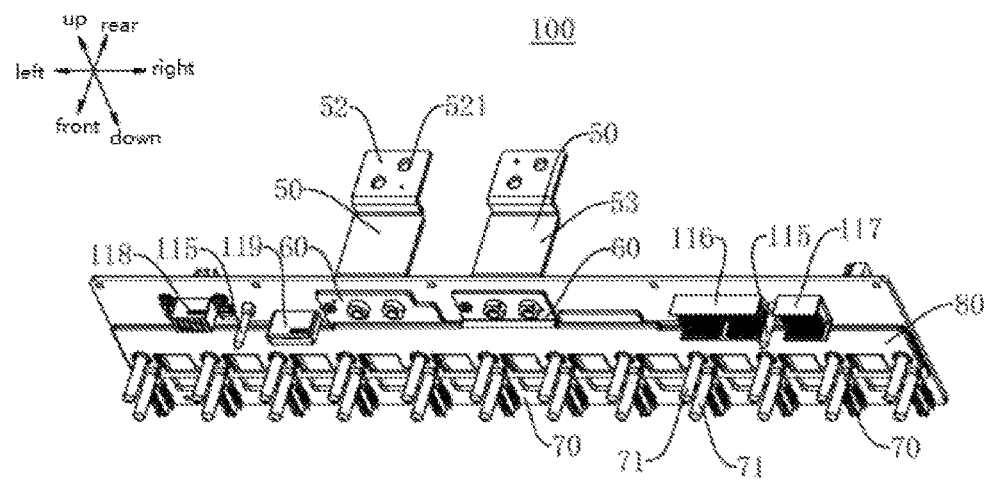
FIG. 4 is a second angle of schematic view of a circuit board according to an embodiment of the disclosure.
Figure 9:
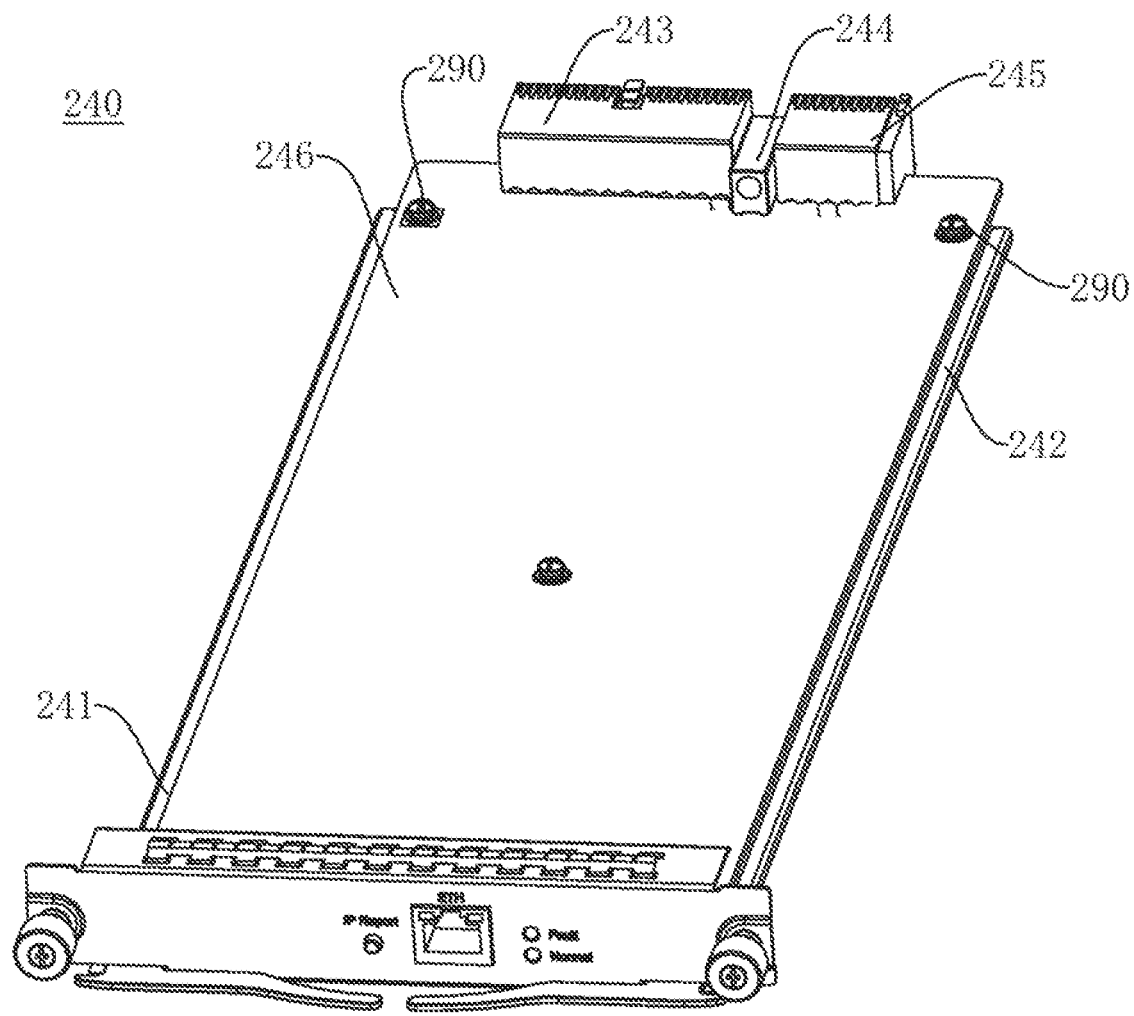
FIG. 9 is a schematic view of a control module according to an embodiment of the disclosure.

In combination with FIG. 1, FIG. 4 and FIG. 9, the control module 240 may include a control board body 241 and a first circuit board 246 arranged at one end of the control board body 241 (for example, the back end as shown in FIG. 1). The first circuit board 246 is provided with a first control signal interface 243 and a second control signal interface 245. The first control signal interface 243 is suitable for connecting with the first port 116 of the electrical connection board 100 to realize signal connection. The second control signal interface 245 is adapted to be connected with the second port 117 of the electrical connection board 100 to transmit current. The electrical connection board 100 can be arranged at the rear end of the control module 240 to facilitate the connection of the first control signal interface 243 to the electrical connection board 100 to realize the signal connection. The control board body 241 can carry the first circuit board 246 to ensure the stable connection between the first circuit board 246 and the electrical connection board 100.

The two sides of the third accommodation space 233 can be provided with sliding stripes, the two sides of the control board 241 are provided with slideways 242, and the control board 241 can move in the third accommodation space 233 by sliding the sliding stripes in the slideways 242. The setting of the slide stripes and the slideways 242 can facilitate the disassembly of the control module 240, and the signal connection between the control module 240 and the electrical connection board 100 can be turned on or off by sliding the control board 241. Referring to FIG. 9, the control module 240 and the power supply module 250 can also include a guide positioning seat 244, and the electrical connection board 100 is provided with a guide positioning post 115 which can extend into the guide positioning seat 244, so as to facilitate the installation and positioning of the control module 240 and the electrical connection board 100, and the power supply module 250 and the electrical connection board 100, so as to further improve the installation efficiency of the control module 240 and the electrical connection board 100, and the power supply module 250 and the electrical connection board 100.

Figure 10:
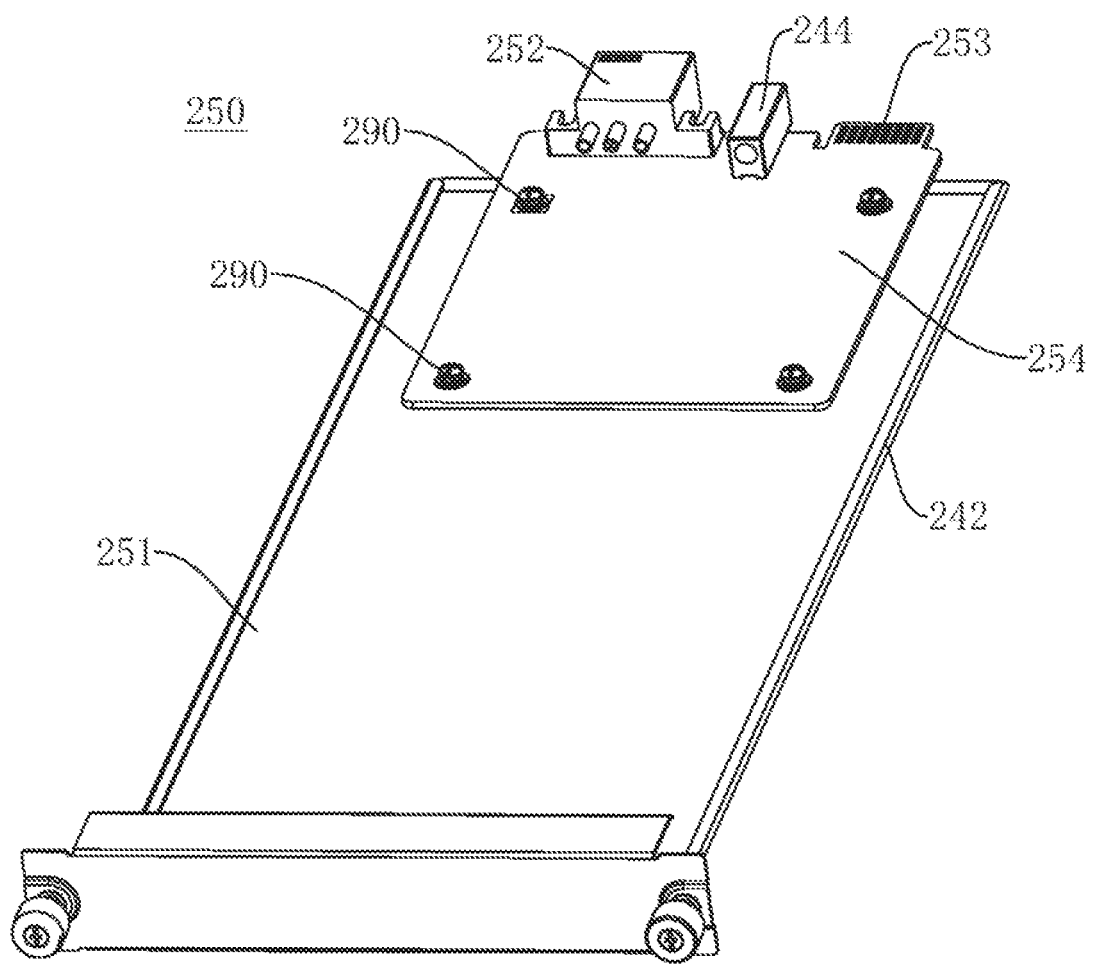
FIG. 10 is a schematic view of a power supply module according to an embodiment of the disclosure.
Figure 11:
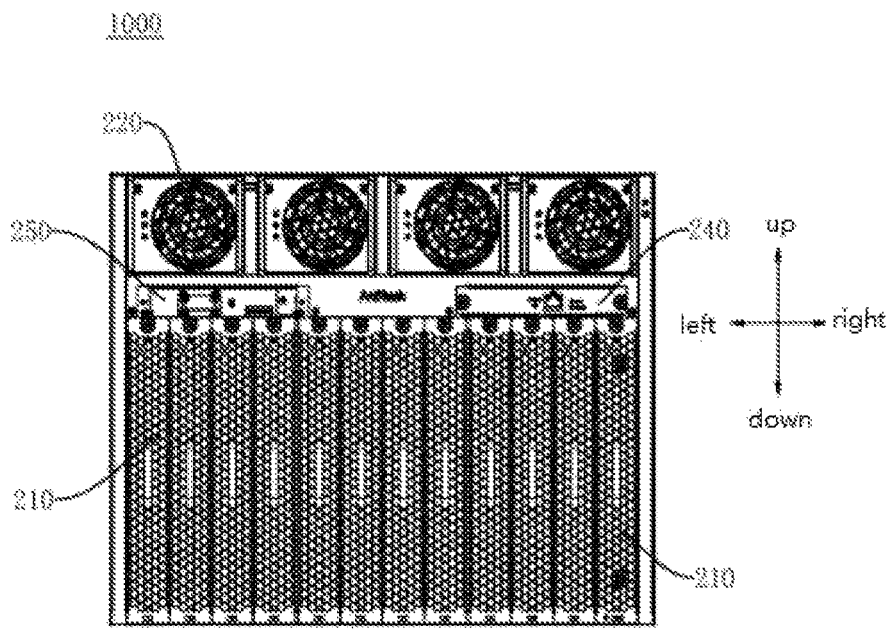
FIG. 11 is a third schematic view of a server according to an embodiment of the disclosure.
Figure 12:
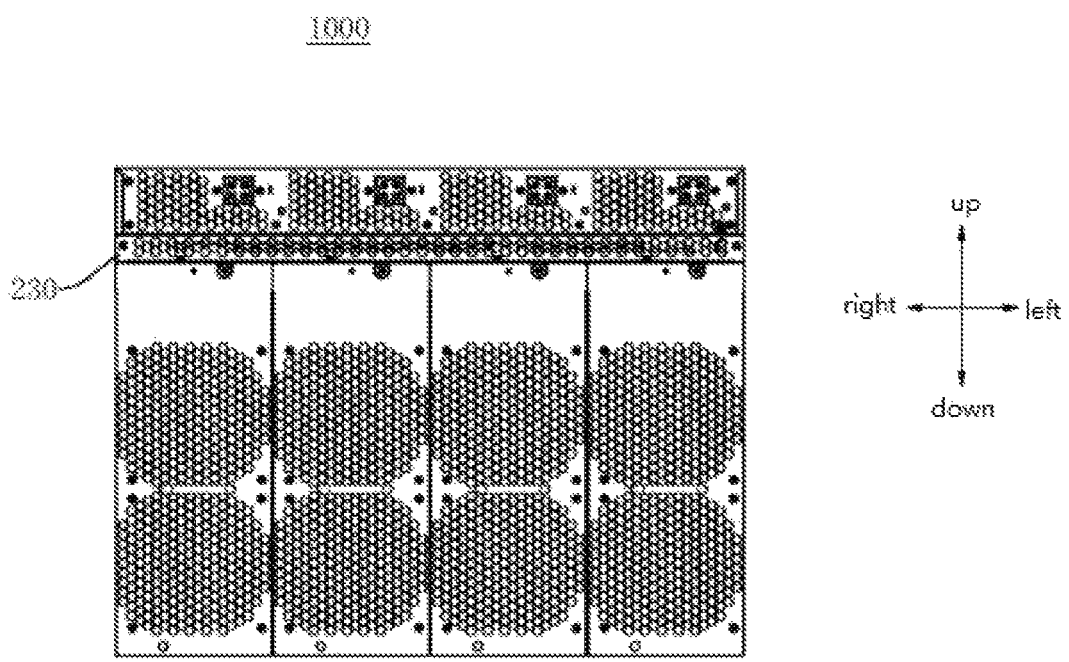
FIG. 12 is a fourth schematic view of a server according to an embodiment of the disclosure.
Figure 13:
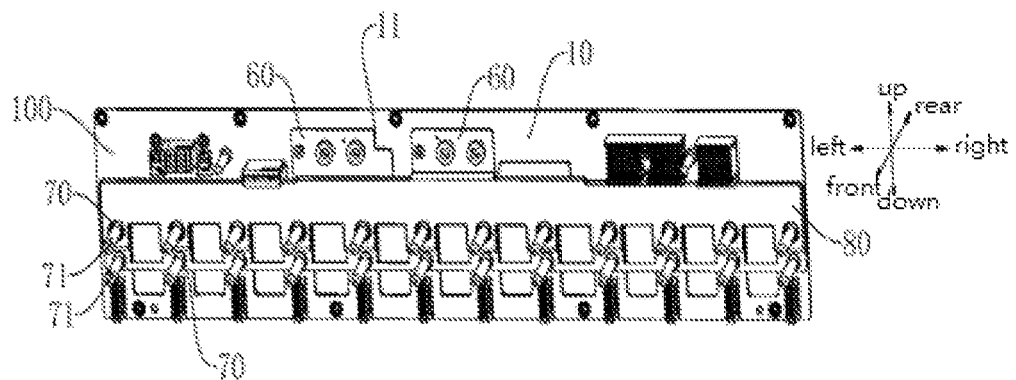
FIG. 13 is a schematic view of an electrical connection board according to an embodiment of the disclosure.

As shown in FIG. 4 and FIG. 10, the power supply module 250 may include a power supply board 251 and a second circuit board 254 arranged at one end of the power supply board 251. The second circuit board 254 is provided with a first current interface 252 and a second current interface 253. The first current interface 252 is suitable for connecting with the third port 118 of the electrical connection board 100 to access the external voltage. The second current interface 253 is suitable for connecting with the fourth port 119 of the electrical connection board 100 to transmit current, so that the power supply module 250 can access the external voltage and connect the voltage to the electrical connection board 100 electrically connected with the control module 240, so that the power supply module 250 supplies power to the control module 240.

In some embodiments, the power supply module 250 may include a protective cover (not shown in the figures), and the protective cover may be arranged on the second circuit board 254 to protect the second circuit board 254. At the same time, the protective cover can be provided with an opening open to the electrical connection board 100, so as to facilitate the connection of the first current interface 252, the second current interface 253 and the guide positioning seat 244 with the electrical connection board 100.

In some embodiments of FIG. 1 and FIG. 10, both sides of the fourth accommodation space 234 may also have sliding stripes, and the power supply board 251 may also be provided with slideways 242 on both sides. The power supply board 251 can move in the fourth accommodation space 234 by sliding the sliding stripes in the slideways 242, so as to facilitate the disassembly of the power supply module 250. By sliding the power supply board body 251, the electrical connection between the power supply module 250 and the electrical connection board 100 can be turned on or off.

For example, 380V or 220V AC voltage is introduced from the outside, and the AC voltage is converted to 48V DC voltage through the power module 220. The hash board 210 can be equipped with the step-down circuit module to reduce the voltage to 12V, and then input to the hash chip on the hash board 210 for power supply. At the same time, the power supply module 250 can receive the 220 V voltage from the external or the electrical connection board 100, convert the 220 V AC voltage into 12 V DC voltage through the power supply module 250, and then supply power to the control module 240. In this way, the control module 240 and the computing board 210 are separately powered, realizing the dual circuit power supply of the server 1000.

The server 1000 can be equipped with a fifth port 280 for receiving external voltage (for example, 220 V AC voltage), the second port 117 can be connected with the first current interface 252, so that the voltage can be connected to the power supply module 250 through the electrical connection board 100, and the first circuit board 246 can be the step-down circuit board, so as to reduce the voltage (for example, 220 V AC voltage can be reduced to 12 V DC voltage). The second current interface 253 of the power supply module 250 (for example, the second current interface 253 may be a gold finger interface) may be plugged into the fourth port 119 of the electrical connection board 100 to connect the voltage to the electrical connection board 100 to supply power to the control module 240.

Specifically, the electrical connection board 100 can conduct current to the first port 116, and the control module 240 can have a first control signal interface 243 and a second control signal interface 245. For example, the first control signal interface 243 can be connected with the first port 116 to receive current, so that the power supply module 250 can supply power to the control module 240. The second control signal interface 245 may be connected with the second port 117 of the electrical connection board 100 to transmit information, such as sending control information and receiving feedback information. Of course, the electrical connection board 100 can also conduct current to the second port 117, the second control signal interface 245 can be connected with the second port 117 to receive current, and the first control signal interface 243 can be connected with the first port 116 to transmit information, which is not limited here.

For example, as shown in FIGS. 9 and 10, the first circuit board 246 may protrude from the rear end of the control board body 241 as shown in FIG. 4, and the second circuit board 254 may protrude from the rear end of the power supply board body 251 as shown in FIG. 4, so that the multiple interfaces can be connected with multiple ports and are connected firmly. The first circuit board 246 can be fixed on the control board body 241 by a plurality of fastening screws 290, and the second circuit board 254 can be fixed on the power supply board 251 by the plurality of fastening screws 290, thereby improving the connection stability.

For example, the control board 241, the power supply board 251 and the protective cover can all be made of metal materials, so as to ensure the good structural strength of the control module 240 and the power supply module 250. At the same time, the control board 241 and the power supply board 251 can both be provided with a slideway 242, so as to facilitate the sliding cooperation of the slideway 242 and the slide stripe, ensure the smooth sliding of the slideway 242 and the slide stripe, and facilitate the control board 241 and the power supply board 251. The detachable connection between the power supply board body 251 and the housing 230 can improve the reliability of conducting or disconnecting the electrical connection between the power supply module 250 and the electrical connection board 100, and between the control module 240 and the electrical connection board 100.

In some embodiments, the hash board 210, the control module 240 and the power supply module 250 are all located on one side of the electrical connection board 100 along a second direction (for example, the front-rear direction as shown in FIG. 1 and FIG. 2), and the second direction is parallel to the extension direction of the hash board 210, so as to facilitate the connection of the electrical connection board 100 with the hash board 210, the control module 240 and the power supply module 250.

Figure 3:
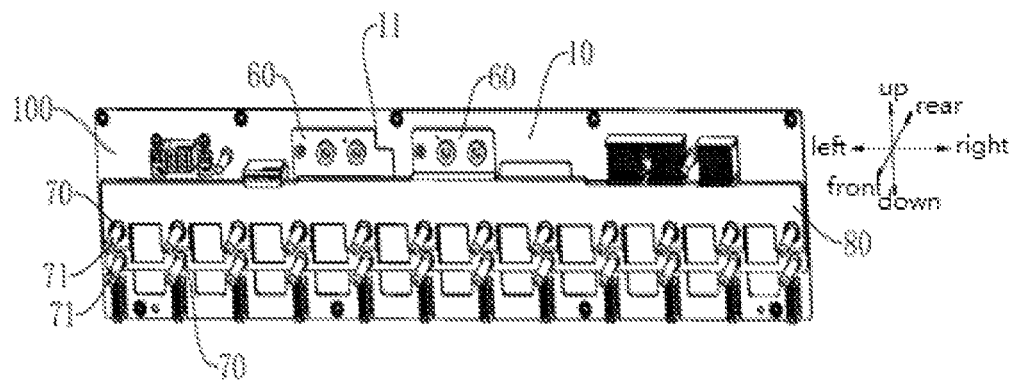
FIG. 3 is a first angle of schematic view of a circuit board according to an embodiment of the disclosure.

In combination with FIG. 1-FIG. 8 and FIG. 27, the electrical connection board 100 may include a PCB substrate 10, a first conductive layer 20, a second conductive layer 30, a first conductive strip 50 and a second conductive strip 60. The PCB substrate 10 is provided with two contact areas 11 respectively connected with the positive and negative electrodes of the power supply, and the two sides of each contact area 11 are respectively provided with a first contact surface 111 and a second contact surface 112 suitable for contacting with the conductor, "Two sides of the contact area 11" refer to, for example, two sides in the front-and-rear direction as shown in FIGS. 3 and 4. Each contact area 11 has a plurality of through holes 113. Combining with FIG. 3 and referring to FIGS. 7-8, the first contact surface 111 and the second contact surface 112 are relatively arranged along the fore-and-aft direction as shown in FIG. 3, and the through hole 113 runs through the first contact surface 111 and the second contact surface 112 along the fore-and-aft direction as shown in FIG. 3.

The first conductive layer 20 is arranged on the first contact surface 111, the second conductive layer 30 is arranged on the second contact surface 112, and the third conductive layer 40 is arranged in the through hole 113 and electrically connected with the first conductive layer 20 and the second conductive layer 30. In this way, the plurality of through holes 113 can be metallized hole. "Metallized hole" refers to plating conductive layer on the hole wall of insulated through hole 113 by electroless plating and electroplating methods to make them reliably connected with each other. The hole wall of multiple through holes 113 can be provided with a third conductive layer 40 to make them connected.

The first conductive strip 50 is fixed to the first conductive layer 20 and electrically connected with the first conductive layer 20. The first conductive strip 50 is suitable for connecting the power module 220. The second conductive strip 60 is connected to the second conductive layer 30 and electrically connected with the second conductive layer 30. The second conductive strip 60 is electrically connected with the hash board 210 of the server 1000. In this way, the current flow path can be as follows: the power module 220 conducts the current to the first conductive strip 50, then through the first conductive layer 20 to the third conductive layer 40, and then to the second conductive layer 30, and then through the second conductive strip 60 to the chip on the hash board 210, so as to realize the power supply of the power module to the hash board.

Thus, the first conductive layer 20, the second conductive layer 30 and the third conductive layer 40 so arranged can be connected as a whole, so that the two sides in the front and rear directions of the PCB substrate 10 can be connected to form a conductor. In this way, there is no need to hollow out the electrical connection board 100 to pass the conductive strip through the electrical connection board 100 to achieve conductivity, which can ensure the structural reliability of the electrical connection board 100. At the same time, the restriction of the electrical connection board 100 on the structure of the first conductive strip 50 and the second conductive strip 60 can be avoided, so that the first conductive strip 50 and the second conductive strip 60 can be set to be larger or smaller according to the demand, and can be in a variety of forms, so that the electrical connection board 100 can be suitable for a variety of servers 200. In addition, the PCB substrate 10 so arranged avoids the coupling between the first conductive strip 50 and the second conductive strip 60, and only the first conductive strip 50 or the second conductive strip 60 can be disassembled, which is convenient for the disassembly of the electrical connection board 100, and improves the replacement efficiency and maintenance efficiency.

Figure 8:
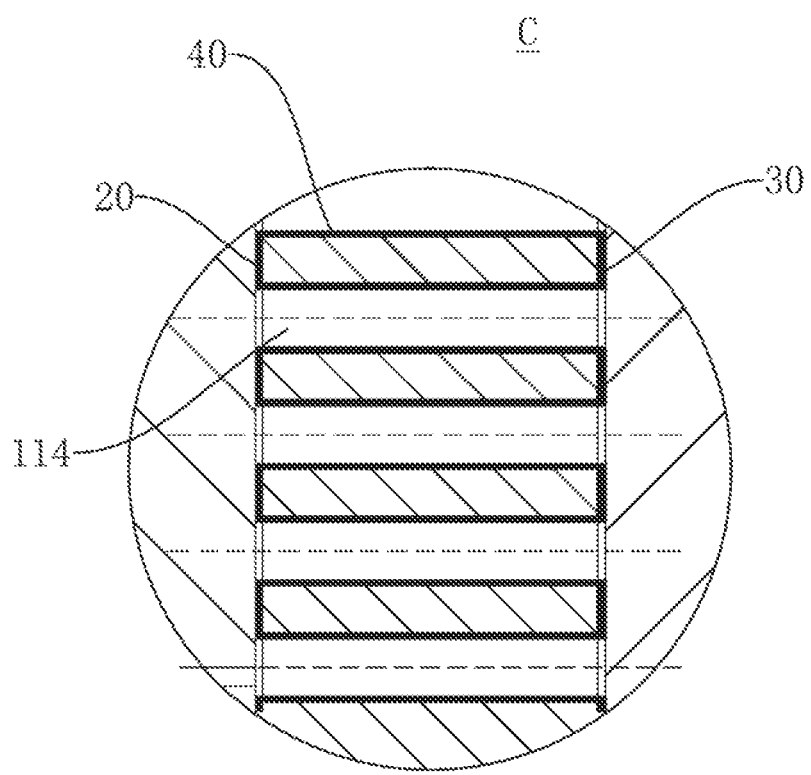
FIG. 8 is a partial enlargement view at part C of FIG. 7.

In some embodiments, both the first conductive layer 20 and the second conductive layer 30 are configured as conductive films coated on the first contact surface 111 and the second contact surface 112. The conductive film can be a kind of conductive film. The conductive film has good adhesion with the first contact surface 111 and the second contact surface 112, which makes the first conductive layer 20 and the first contact surface 111, the second conductive layer 30 and the second contact surface 112 fit effectively, thus ensuring the smooth passage of the current. For example, the first conductive layer 20 and the second conductive layer 30 may cover the entire first contact surface 111 and the second contact surface 112, respectively. Alternatively, as shown in FIG. 8, the first conductive layer 20 and the second conductive layer 30 may avoid multiple through holes 113, and the first conductive layer 20 and the second conductive layer 30 are in contact with the third conductive layer 40 to ensure effective electrical connection between the first conductive layer 20, the second conductive layer 30 and the third conductive layer 40.

According to an embodiment of the disclosure, the third conductive layer 40 may be configured as a conductive film board on the side wall of through hole 113 to ensure the effective transmission of current. Alternatively, the third conductive layer 40 may be composed of a conductive material through the through hole 113. Thus, the first conductive layer 20, the second conductive layer 30 and the third conductive layer 40 can be connected, and the two sides of the electrical connection board 100 can be connected into a conductor.

Figure 27:
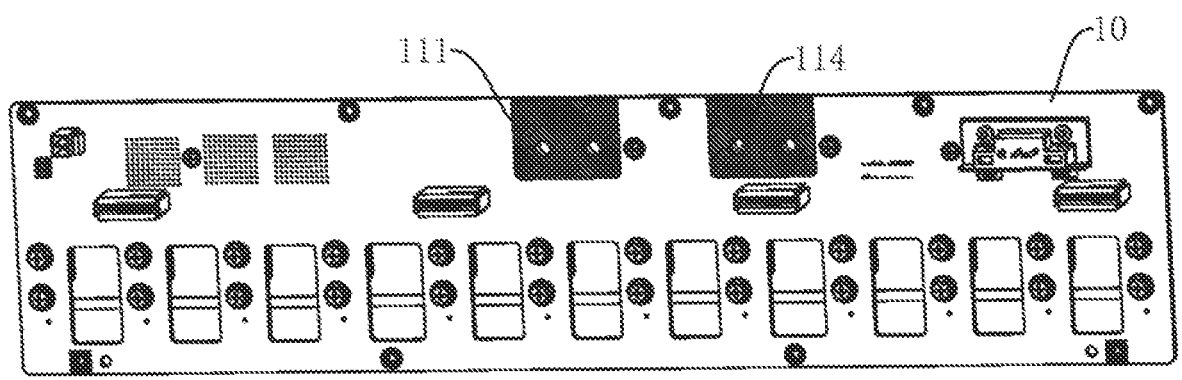
FIG. 27 is a schematic view of an electrical connection board according to an embodiment of the disclosure.

In the examples of FIG. 3 and FIG. 27, the PCB substrate 10 can also have screw holes 114, the first conductive strip 50 and the second conductive strip 60, and the PCB substrate 10 are connected by screws, so as to ensure the stability of the connection between the first conductive strip 50, the second conductive strip 60 and the PCB substrate 10. At the same time, this setting can be easily disassembled. For example, Both contact areas 11 are provided with screw holes 114, which are riveted or bolted to the threaded holes of the first conductive strip 50, the second conductive strip 60 and the PCB substrate 10. A plurality of through holes 113 may be arranged around the screw holes 114. The diameter ratio of the through hole 113 to the screw hole 114 can be in the range of 1/10-1/100. In this way, the connection stability between the first conductive strip 50, the second conductive strip 60 and the PCB substrate 10 can be ensured, and the effective electrical connection between the first conductive layer 20, the second conductive layer 30 and the third conductive layer 40 can be ensured.

Figure 6:
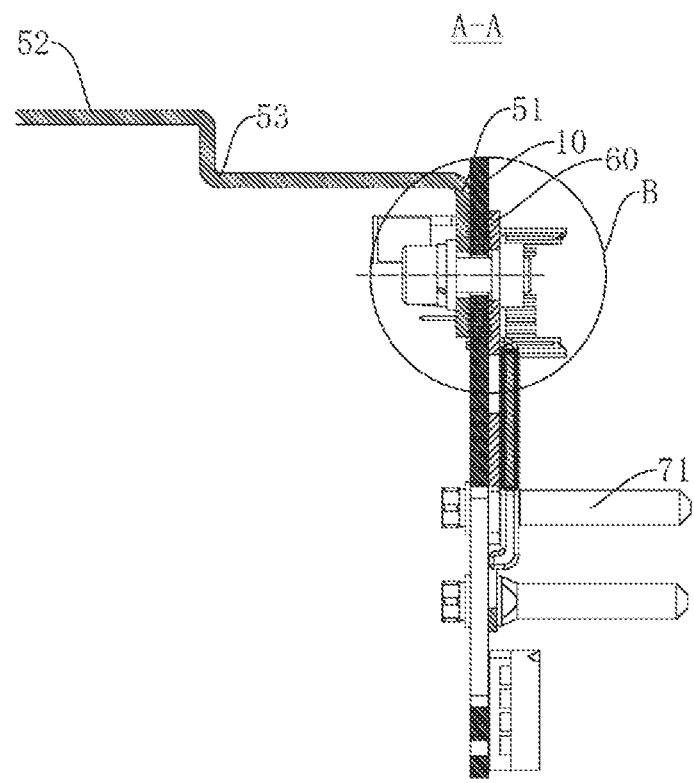
FIG. 6 is a sectional view at A-A of FIG. 5.

In some embodiments, as shown in FIG. 4 and FIG. 6, the first conductive strip 50 may include a first conductive sheet 51, a second conductive sheet 52 and a connecting sheet 53. The first conductive sheet 51 is connected with the first conductive layer 20, and the second conductive sheet 52 is connected with the power supply module 220. The connecting sheet 53 is connected between the first conductive sheet 51 and the second conductive sheet 52. The first conductive sheet 51, the second conductive sheet 52 and the connecting sheet 53 arranged in this way can facilitate the connection between the first conductive strip 50 and the power module 220. For example, the first conductive sheet 51, the second conductive sheet 52 and the connecting sheet 53 can be integrally formed to ensure the structural strength of the first conductive strip 50.

Figure 7:
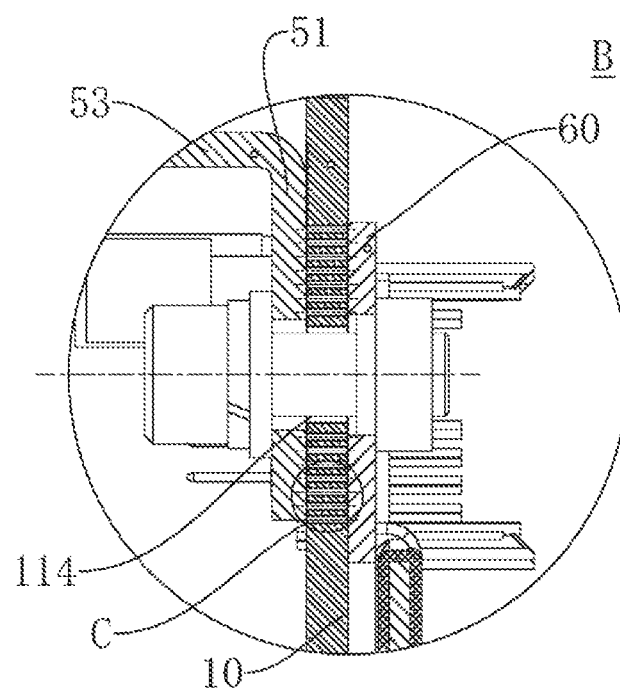
FIG. 7 is a partial enlargement view at part B of FIG. 6.

Optionally, referring to FIGS. 4, 6 and 7, the connecting sheet 53 may be configured as an L-shaped and connected vertically with the first conductive sheet 51 and the second conductive sheet 52 respectively. For example, both the first conductive sheet 51 and the second conductive sheet 52 may be made of copper or copper alloy so that the first conductive sheet 51 and the second conductive sheet 52 have good ductility and conductivity. At the same time, the connecting board 53 made of copper or copper alloy has good bending ability, which is convenient for processing and has good structural reliability.

The power module 220 can be arranged in the second accommodation space 232 of the housing 230. By setting the L-shaped connecting sheet 53, the second conductive sheet 52 can be extended into the second accommodation space 232 to facilitate the connection between the power module 220 and the first conductive strip 50, and further improve the stability of the connection. The second conductive sheet 52 may be provided with a perforation 521, and the screw may pass through the hole 521 to make the power module 220 and the first conductive strip 50 firmly connected. In addition, the connecting sheet 53 is vertically connected with the first conductive sheet 51 and the second conductive sheet 52 respectively, which can reduce the occupied space and make the internal parts of the server 200 compact.

In some embodiments, in combination with FIG. 4 and FIG. 7, the electrical connection board 100 may also include two conductive connection boards 70 and an insulating layer 80. The two conductive connection boards 70 are respectively connected with the second conductive strip 60 of the two contact areas 11 to connect the positive and negative power supply respectively, and each conductive connection board 70 is provided with a plurality of conductive pins 71. The conductive pins 71 on the two conductive connecting boards 70 correspond to each other to form a plurality of pairs of conductive pins 71. For example, the two conductive pins 71 arranged in the up-down directions of FIG. 4 may be a pair of conductive pins 71. Each pair of conductive pins 71 corresponds to each hash board 210 and is electrically connected to supply power to the hash board 210. The insulating layer 80 is arranged between the two conductive connecting boards 70 to avoid short circuit between the conductive connecting boards 70 connecting the positive electrode and the negative electrode of the power supply.

Thus, by setting the conductive pin 71, the electrical connection board 100 can be directly inserted into a plurality of hash boards 210. By omitting the screw setting and avoiding the steps of removing and installing the screws, the installation or removal is convenient, the operation steps are simplified, and the maintenance efficiency is improved. In addition, a plurality of conductive pins 71 of the electrical connection board 100 can be respectively connected with a plurality of hash boards 210 to supply power to the plurality of hash boards 210 at the same time without setting a plurality of electrical connection boards 100, which improves the integration degree of the server 200 and reduces the cost and operation steps.

For example, the conductive connecting board 70 at the upper end as shown in FIG. 4 is connected with the contact area 11 at the left end as shown in FIG. 4, and the contact area 11 can be connected with the negative electrode of the power supply, so that the conductive connecting board 70 is connected with the negative electrode of the power supply. The conductive connecting board 70 at the lower end as shown in FIG. 4 is connected with the contact area 11 at the right end as shown in FIG. 4, and the contact area 11 can be connected with the positive electrode of the power supply, so that the conductive connecting board 70 can be connected with the positive electrode of the power supply, so as to realize the transmission of current.

Figure 5:
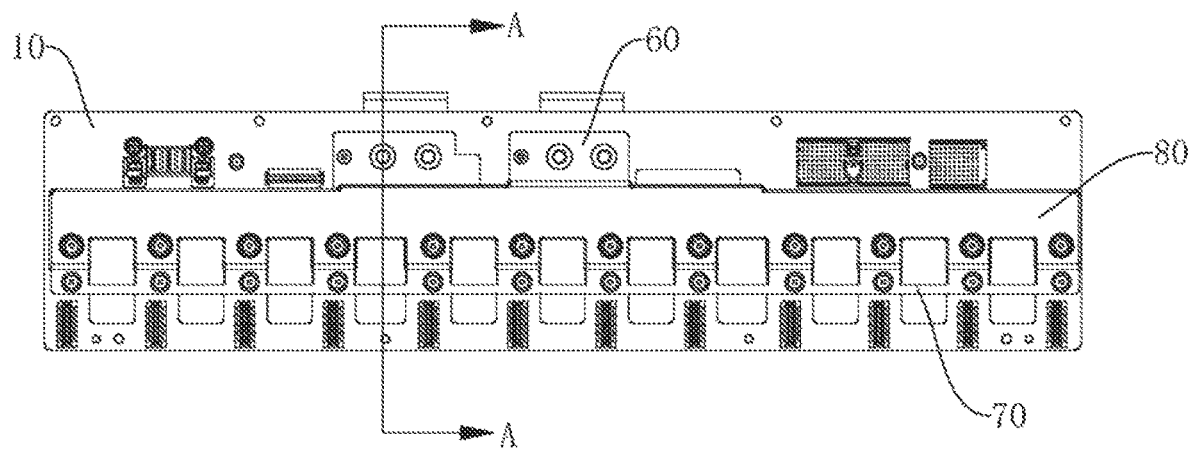
FIG. 5 is a third angle of schematic view of a circuit board according to an embodiment of the disclosure.

As shown in FIG. 4 and FIG. 5, the two conductive connecting boards 70 are parallel in the length direction of the PCB substrate 10 (for example, the left-right directions as shown in FIG. 4), and a predetermined gap is spaced in the height direction of the PCB substrate 10 (for example, the up and down directions as shown in FIG. 4). In the length direction of each conductive connecting board 70, a plurality of conductive pins 71 are evenly spaced to facilitate the connection with a plurality of hash boards 210.

The insulating layer 80 may be arranged at the positive electrode of the conductive connection board 70. The insulating layer 80 can be an insulating material coated or board on the conductive connecting board 70 of the positive electrode. The insulating layer 80 has good stability and can effectively avoid short circuit between the two conductive connecting boards 70. Of course, the insulating layer can also be arranged at the negative electrode of the conductive connection board 70, and it is not limited here.

Figure 14:
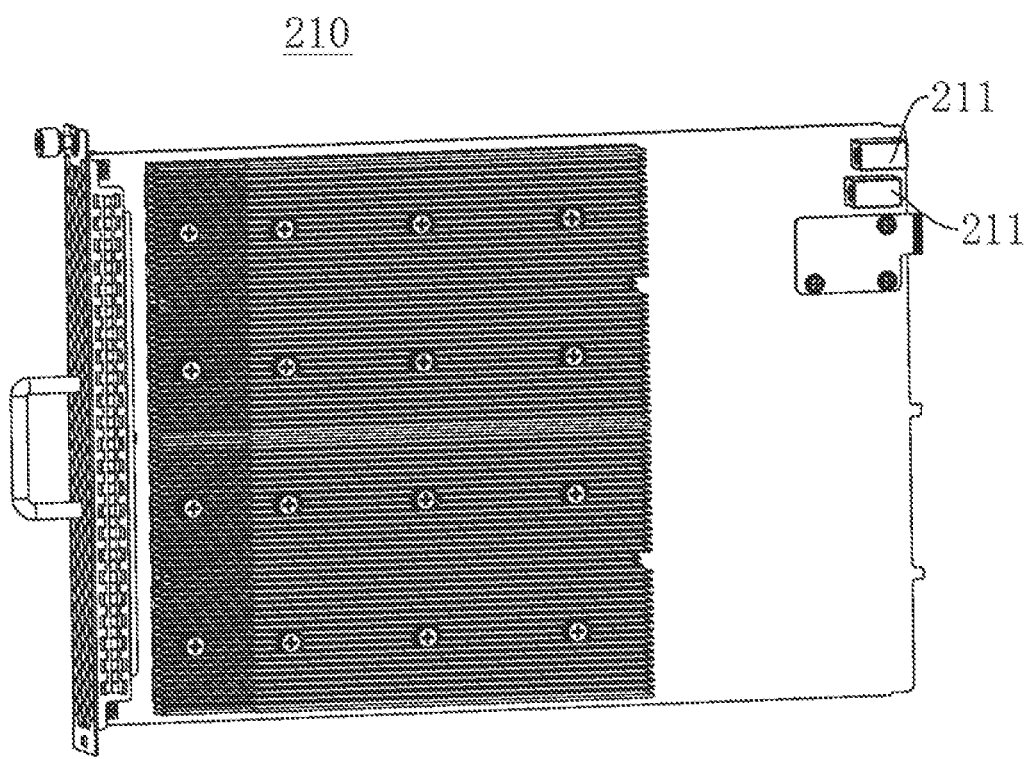
FIG. 14 is a first angle of schematic view of a hash board according to an embodiment of the disclosure.
Figure 16:
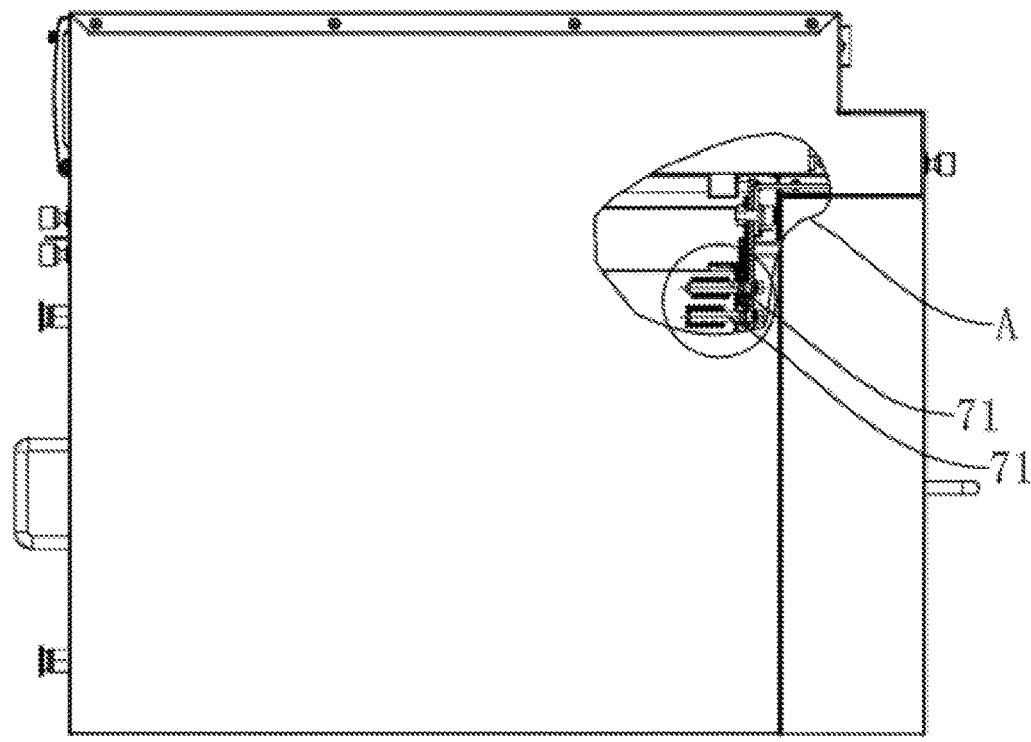
FIG. 16 is a sectional view of a part of the structure of a hash board according to an embodiment of the disclosure.
Figure 17:
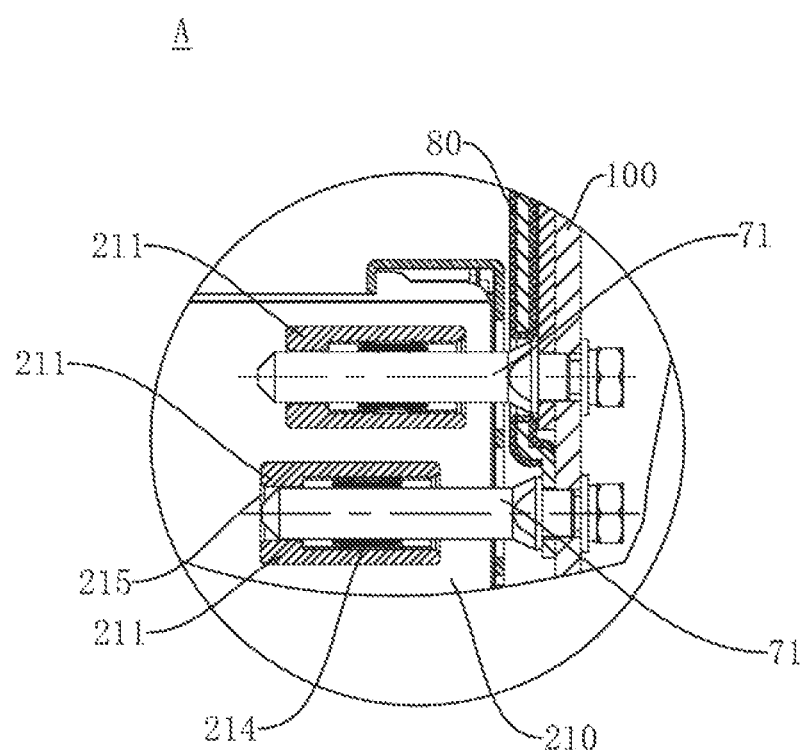
FIG. 17 is a partial enlargement view at part D of FIG. 16.

In some embodiments, as shown in FIG. 14, FIG. 16, and FIG. 17, the end of the hash board 210 toward the electrical connection board 100 has a mount seat 211. Each hash board 210 is provided with two mounting seats 211 arranged up and down, and each pair of conductive pins 71 can extend into the two mounting seats 211. The mounting seat 211 can be a conductive part to realize the current conduction when the conductive pin 71 extends into the mounting seat 211. The mounting seat 211 may be arranged on one side of the board body of the hash board 210 (for example, one side in the left and right directions in FIG. 11), that is, two mounting seats 211 of the same hash board 210 may be simultaneously arranged on the left side of the board body of the hash board 210, or two mounting seats 211 may be simultaneously arranged on the right side of the board body of the hash board 210. The mounting seat 211 can be a convex structure protruding from the board body of the force calculation board 210 to facilitate the extension of the conductive pin 71 and ensure the structural reliability of the hash board 210. The first fitting part can be arranged in the mounting seat 211, and the conductive pin 71 can be detachably matched with the first fitting part. Through the setting of the first fitting part, the installation can be convenient, and the installation reliability of the conductive pin 71 and the mounting seat 211 can be improved.

In some embodiments, one of the hook and the slot can be set in the mounting seat 211, and the other of the hook and the slot can be set on the conductive pin 71. Through the cooperation of the hook and the slot, the electrical connection between the hash board 210 and the conductive pin 71 can be realized. At the same time, the installation stability of the mounting seat 211 and the conductive pin 71 can be ensured through the setting of the hook and the slot.

In other embodiments, as shown in FIG. 14-FIG. 17, the mounting seat 211 can be provided with a mounting hole 213. The inner wall of the mounting hole 213 has a reed 214 protruding toward the axis of the mounting hole 213. The conductive pin 71 is formed into a cylinder, and the conductive pin 71 is inserted into the mounting hole 213 and connected with the reed 214. It should be noted that the reed 214 is made by conductive material. When the conductive pin 71 extends into the mounting hole 213, the conductive pin 71 can press the reed 214 towards the inner wall of the mounting hole 213, so as to ensure that there is a certain interaction force between the conductive pin 71 and the conductive seat, so as to ensure that there is an effective contact between the conductive pin 71 and the conductive seat, so as to realize the current conduction between the conductive pin 71 and the conductive seat. The reliability of the electrical connection between the electrical connection board 100 and the hash board 210 can be guaranteed.

Figure 15:
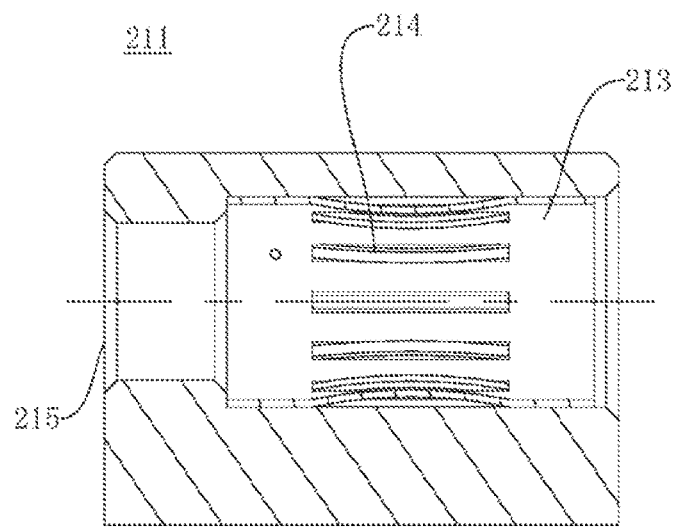
FIG. 15 is a schematic view of a mounting seat according to an embodiment of the disclosure.

As shown in FIG. 15-17, one end of the mounting seat 211 (for example, the front end as shown in FIG. 16) can also be provided with a round hole 219, which is opposite to the mounting hole 213, so that the round hole 219 and the mounting hole 213 can pass through the mounting seat 211. The hole diameter of the round hole 219 can be slightly larger than that of the conductive pin 71, and the hole diameter of the round hole 219 is smaller than that of the mounting hole 213. The round hole 219 has the function of positioning the conductive pin 71, so as to avoid the eccentric position of the conductive pin 71 due to processing, assembly errors, or stress, so as to avoid the excessive deformation of the reed 214 in a certain direction, On the other hand, the deformation in the opposite direction is small, which ensures the uniform contact between the conductive pin 71 and the reed 214.

For example, combining with FIG. 17, two mounting seats 211 on the same hash board 210 can be staggered in the up and down directions, so that after one conductive pin 71 is inserted into the mounting seat 211 at the upper end, the conductive pin 71 can extend out of the mounting seat 211, and after the other conductive pin 71 is inserted into the mounting seat 211 at the lower end, the conductive pin 71 cannot extend out of the mounting seat 211. The guide pin can be installed on the electric connecting board 100 by screws, or the guide pin can be integrally formed with the electrical connecting board 100.

Further, as shown in FIGS. 14 and 15, both ends of reed 214 can be fixed to the inner wall of the mounting hole 213, and the middle of the reed 214 protrudes towards the axis of the mounting hole 213. Thus, it is convenient for the conductive pin 71 to extend into the mounting hole 213, and is conducive to the mutual force caused by squeezing the reed 214 towards the inner wall direction of the mounting hole 213. For example, the reed 214 may be an arc surface towards the side of the guide pin 71 in order to reduce friction between the guide pin insertion into the conductive seat.

In some embodiments, one end of the reed 214 may be fixed to the inner wall of the mounting hole 213, and the other end may be cocked. In this way, the conductive pin 71 can be easily extended into the mounting hole 213, and a certain interaction force between the conductive pin 71 and the conductive seat can also be ensured, so as to ensure effective contact between the conductive pin 71 and the conductive seat.

Figure 24:
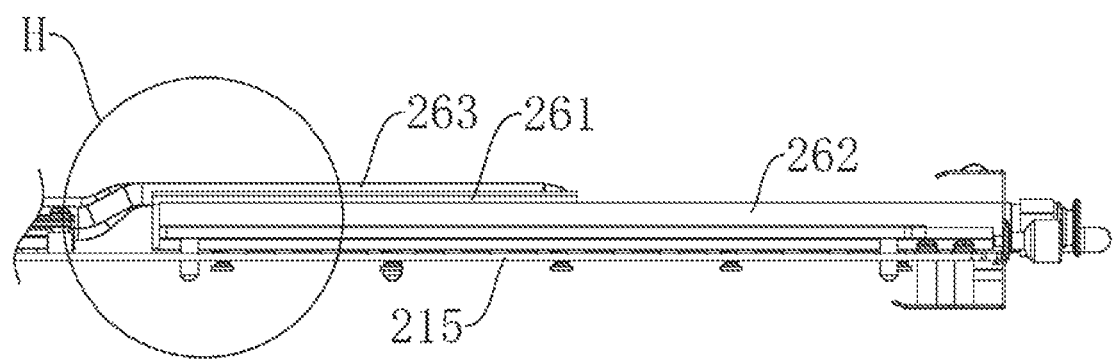
FIG. 24 is a fourth angle of schematic view of a hash board according to an embodiment of the disclosure.
Figure 25:
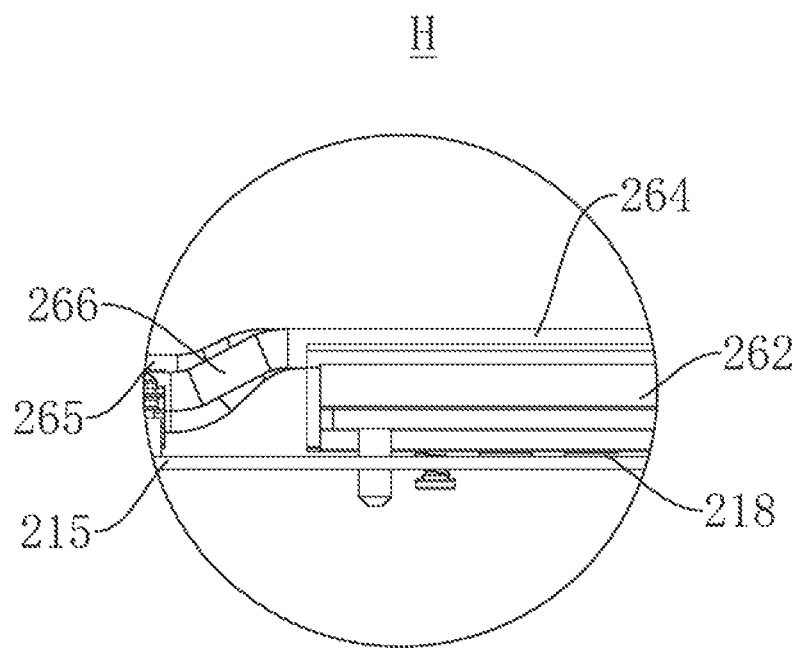
FIG. 25 is a partial enlargement view at part II of FIG. 24.
Figure 26:
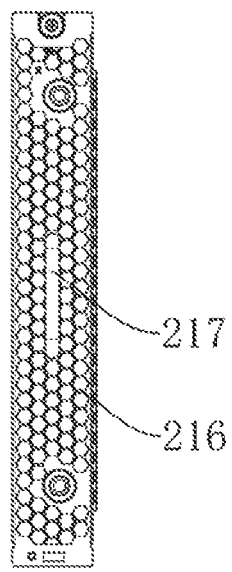
FIG. 26 is a fifth angle of schematic view of a hash board according to an embodiment of the disclosure.

In some embodiments, as shown in FIGS. 24-26, the hash board 210 may include: the hash board body 215, the baffle 216 and the handle 217, and the hash chip 218 may be arranged on the hash board body 215. The baffle 216 is located at one end of the hash board body 215 away from the electrical connection board 100, and the baffle 216 is configured to hold the opening of the first accommodation space 231 by the back baffle 216 in the first accommodation space 231, and thus can protect the hash board body 215 and the hash chip 218 and other parts located in the housing 230. The handle 217 can be arranged on one side of the baffle 216 away from the electrical connection board 100, and the user can control the movement of the hash board 210 by pushing and pulling the handle 217 through the setting of the handle 217. Of course, handle 217 can also be arranged in a plurality of modules such as heat dissipation module 260, so as to facilitate the movement of the module.

It should be noted that the hash board 210 of the embodiment of the invention can be air-cooled or liquid-cooled. In some examples, the hash board 210 is an air-cooled hash board, and the hash board body 215 may also include a heat sink for radiating the hash chip 218. The hash board 210 is arranged in the first accommodation space 231 of the housing 230 and can slide toward the front side of the housing 230. The heat dissipation module 260 is arranged at the rear end of the housing 230 and is positioned corresponding to the power calculation board 210. The heat dissipation module 260 can effectively dissipate heat to the force board 210. In addition, the setting of the heat sink can further heat the hash board 210.

Figure 28:
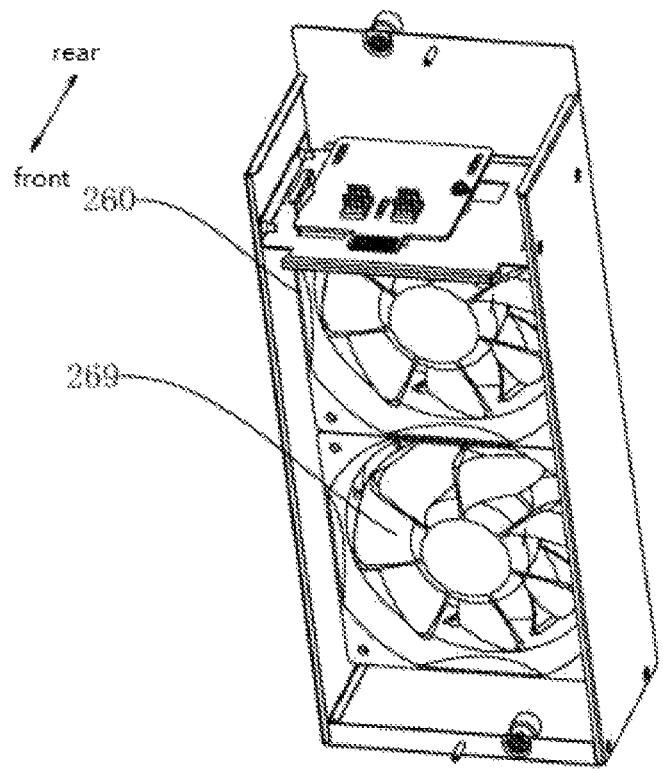
FIG. 28 is a partial structural view of a heat dissipation module according to an embodiment of the disclosure.

As shown in FIGS. 2 and 28, the heat dissipation module 260 includes at least one fan 269 to dissipate heat for the hash board 210. For example, there are 12 air-cooled hash boards and four groups of fans 269, each of which includes two fans arranged along the up-down direction in FIG. 2. Each group of fans 269 is arranged along the left-right direction as shown in FIG. 2, and each group of fans 269 can dissipate heat for three hash boards 210. Each group of fans 269 have sockets electrically connected with the electrical connection board 100, so that the connection between the heat dissipation module 260 and the electrical connection board 100 does not need to pass through wires, so as to make the structure of the server simple and clean.

Figure 18:
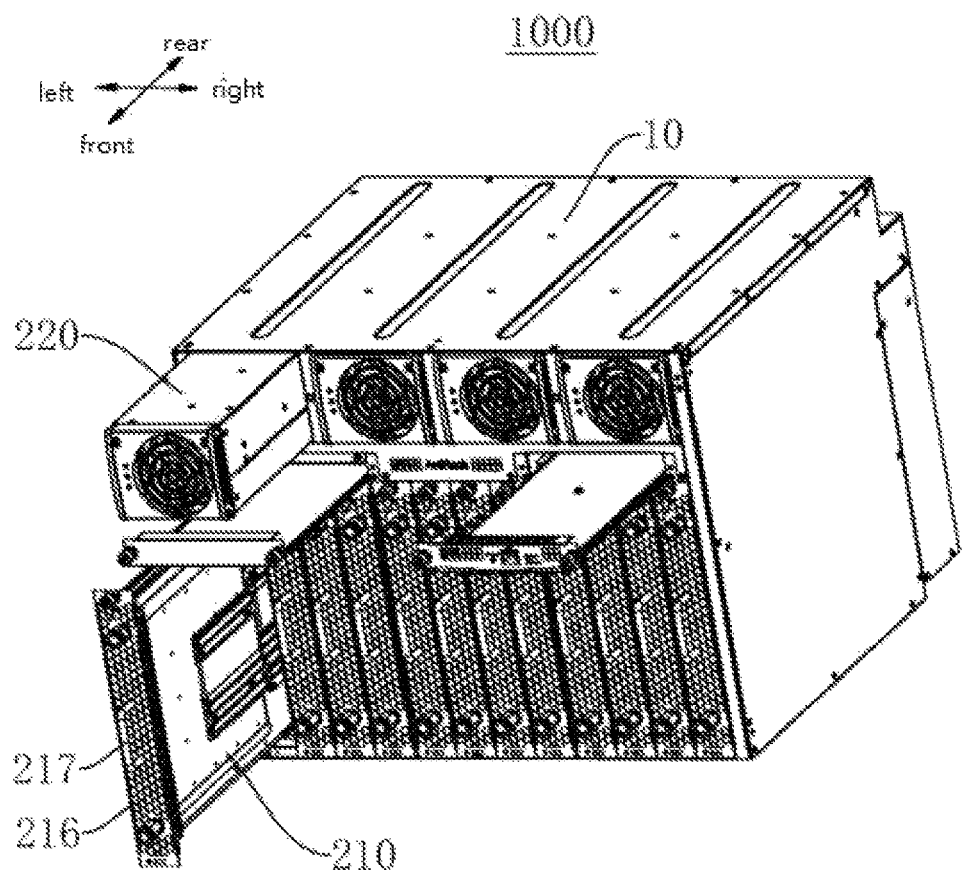
FIG. 18 is a fifth angle of schematic view of a server according to an embodiment of the disclosure.

In other embodiments, as shown in FIGS. 18-26, the hash board 210 may be a liquid cooled hash board. In some embodiments, combined with FIG. 19 and FIG. 22, the power calculation board 210 can also include a step-down circuit module 270, which can be electrically connected with the power module 220 of the server 1000 to play the role of reducing voltage, and then input to the hash chip 218 for power supply. The step-down circuit module 270 is arranged on the hash board 215 and separated from the hash chip 218 in a second direction (for example, the front-rear direction as shown in FIG. 18), and the second direction is parallel to the extension direction of the HASH board 210.

The heat dissipation module 260 may include at least one first cooling board 261, a water cooling board 262 and at least one heat pipe 263. The first cooling board 261 is arranged on the step-down circuit module 270, the water cooling board 262 is arranged on one side surface of the hash body 215, and the heat pipe 43 is arranged on the hash body 215. It should be noted that the medium in the pipeline of "water cooling board 262" does not specifically refer to water, but can be a variety of liquids. Heat pipe 263 is a kind of heat transfer element with high thermal conductivity, which transfers heat through evaporation and condensation of liquid in the pipe. When one end of heat pipe 263 is heated, the liquid at this end will vaporize when it is heated, and the steam will run from the heated end to the other end. The temperature of the other end is low, and the steam will liquefy when it is cooled. The condensed liquid can return to the heated end under the action of capillary force, for example. In this reciprocating cycle, the liquid in the heat pipe 263 vaporizes and liquefies continuously. When the liquid vaporizes and liquefies, it needs to absorb and release a lot of heat respectively. There is a temperature difference between the two ends of the heat pipe 263, so the heat can be transferred quickly, and then it can have the effect of refrigeration.

Meanwhile, the water cooling board 262 and the first cooling board 41 can also play the role of heat dissipation. The step-down circuit module 270 can transfer heat to the first cooling board 261. The first cooling board 261 can dissipate heat for the step-down circuit module 270, and transfer the heat to the heat pipe 263, thus realizing the coordinated heat dissipation of the heat dissipation module 260, and improving the heat dissipation effect. In addition, because the water cooling board 262 has a certain thickness, it is convenient to control the height difference between the two ends of the heat pipe 263 by setting the first cooling board 261, so as to facilitate the setting of the heat pipe 263. In addition, one end of the heat pipe 263 is laid on the first cooling board 261, which can have a large contact area with the step-down circuit module 270, so as to improve the contact area between the heat dissipation module 260 and the step-down circuit module 270, and improve the heat transfer efficiency and effect, so as to heat the step-down circuit module 270 more effectively.

Therefore, by setting a heat pipe 263 on the hash board body 21, and one end of the heat pipe 263, laid on the first cooling board 261, the other end laid on the water cooling board 262, the heat transfer channel can be established, and the setting of the cooling fan can be omitted, so as to reduce the energy consumption and the cost, and make the server 1000 have no noise in heat dissipation, and have good heat dissipation effect and thermal stability. And it can achieve long-distance heat dissipation. At the same time, the utilization efficiency of the water cooling board 262 is increased, which can improve the heat dissipation efficiency of the step-down circuit module 270. In addition, the problems of heat dissipation cascade and hot air return of step-down circuit module 270 on multiple hash boards 20 are avoided, which can facilitate the diversified design of step-down circuit module 270. In addition, the matching arrangement of the first cooling board 261, the water cooling board 262 and the heat pipe 263 of the heat dissipation module 260 can further improve the heat dissipation effect.

The step-down circuit module 270 can have an inductor module and a MOS transistor (field effect transistor). The heat pipe 263 can effectively heat the inductor module and the MOS transistor, avoiding the overheating of the inductor module and the MOS transistor, and ensuring the stability of the step-down circuit module 270. Of course, in other embodiments, the step-down circuit module 270 can also be other structures requiring heat dissipation, such as power supply and circuit board. By designing a water-cooled board 262, it can not only heat the hash chip 218 of the hash board 215, but also heat the step-down circuit module 270 on the hash board 215, which makes full use of the heat dissipation capacity of the water-cooled board 262 and realizes the design without fan.

In some embodiments, the first cooling boards 261 may include a plurality spaced on the step-down circuit module 270, each of which corresponds to at least one heat pipe 263. In other embodiments, the first cooling board 261 may include one end, and one end of all heat pipes 263 is lapped on the first cooling board 261. The layout design of step-down circuit module 270 can be varied. For example, distributed design of nearby power supply or centralized power supply and centralized heat dissipation. The heat dissipation module 260 can be set according to the design of the step-down circuit module 270 to further improve the heat dissipation effect.

For example, the heat pipe 263 can be a copper tube or an aluminum alloy tube, so that the heat pipe 263 has good structural strength, can effectively dissipate heat, and has good bending property, then the heat pipe 263 can cooperate with the design of the step-down circuit module 270 and the water cooling board 262 to form a variety of shapes.

Figure 19:
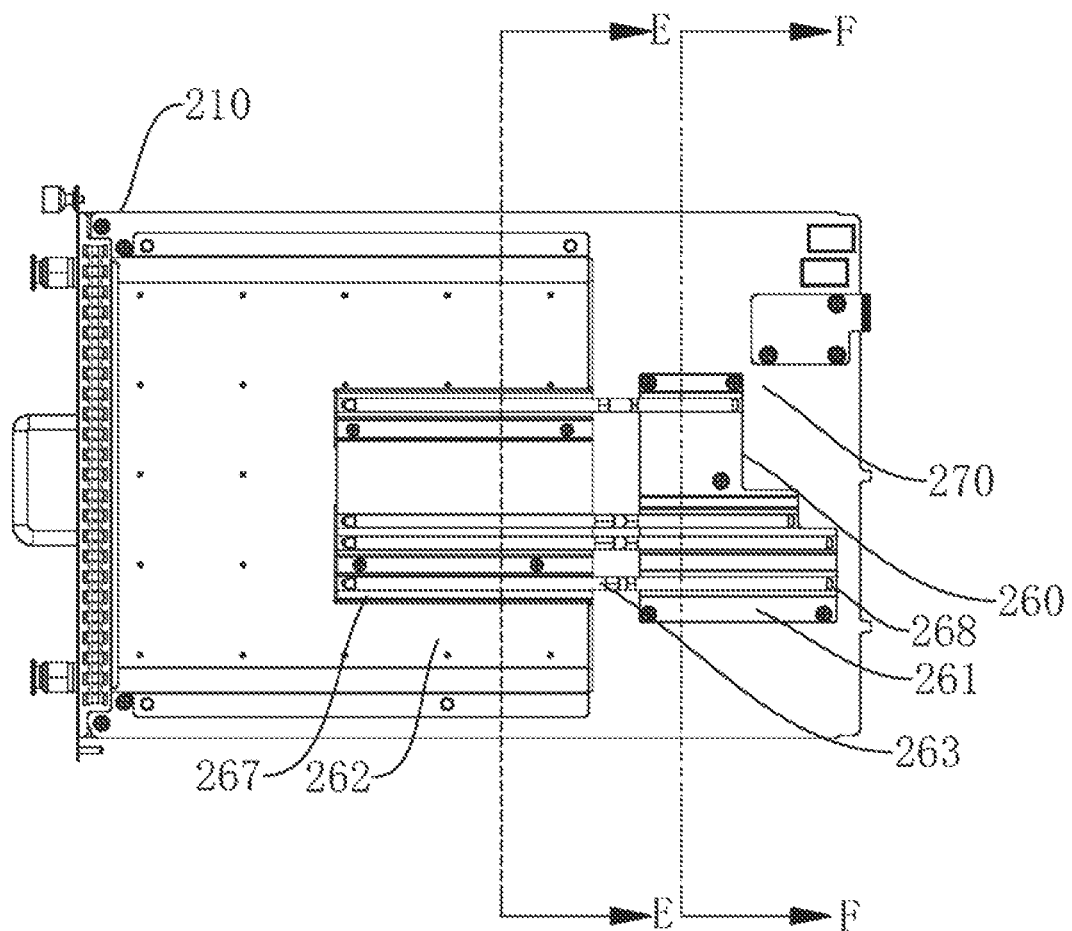
FIG. 19 is a second angle of schematic view of a hash board according to an embodiment of the disclosure.
Figure 22:
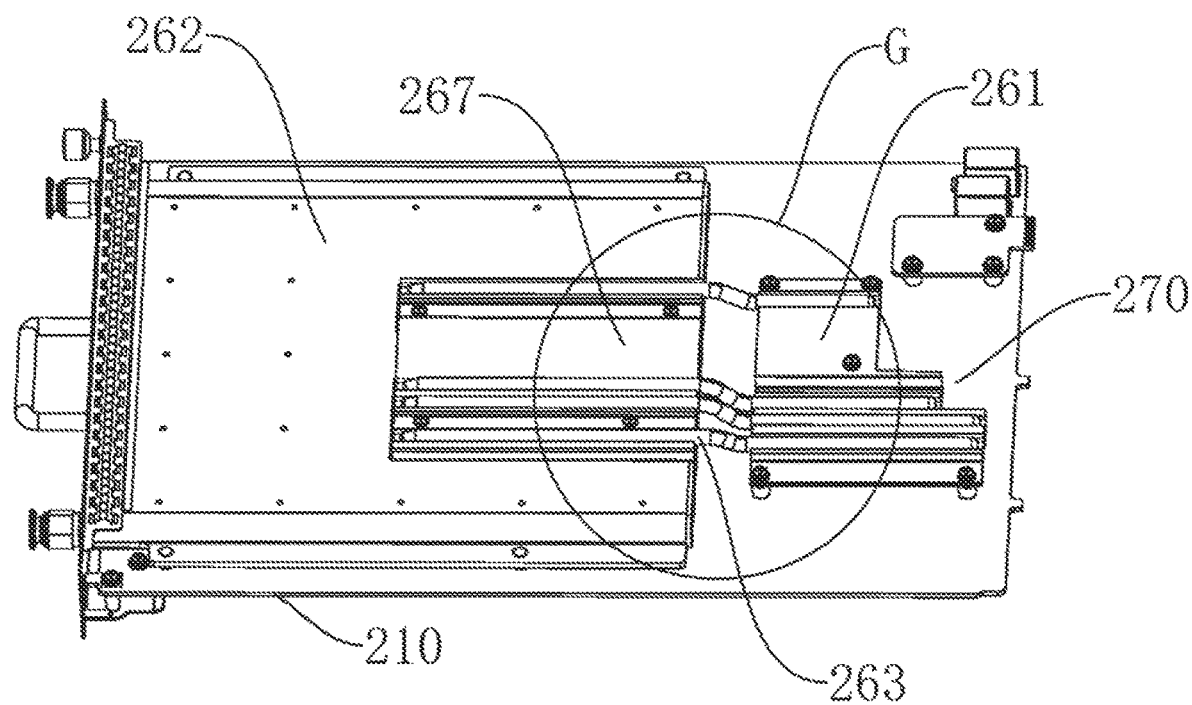
FIG. 22 is a third angle of schematic view of a hash board according to an embodiment of the disclosure.
Figure 23:
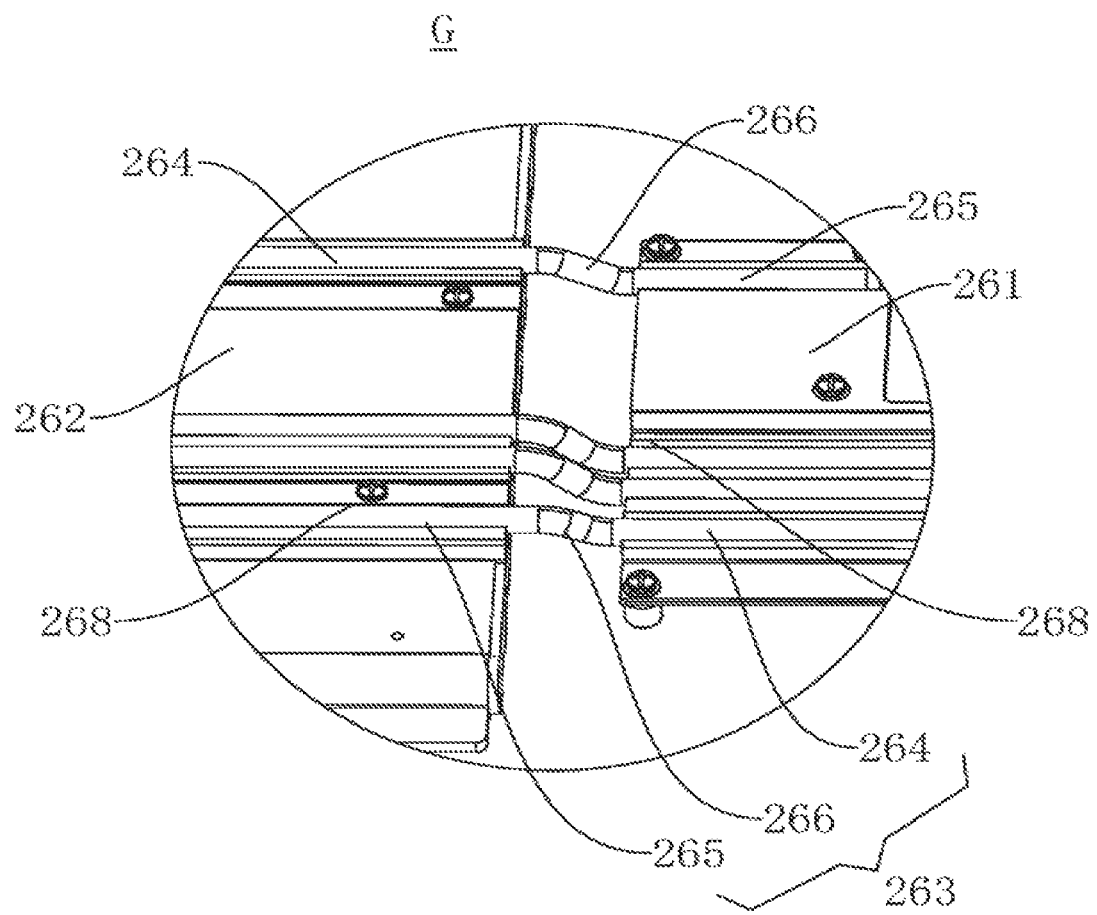
FIG. 23 is s a partial enlargement view at part G of FIG. 22.

In some embodiments, as shown in FIGS. 19, 22 and 23, server 1000 may also include a second cooling board 267, a second cooling board 267 is arranged on one surface of the water cooling board 262 that deviates from the force board body 215, and the other end of all heat pipes 263 is attached to the second cooling board 267. Thus, through the setting of the first cooling board 261 and the second cooling board 267, good heat contact can be achieved to improve the heat dissipation efficiency and cooling effect.

For example, the first cooling board and the second cooling board 267 can both be aluminum alloy boards, and the aluminum alloy boards have good thermal conductivity and high hardness, so that the first cooling board 261 and the second cooling board 267 can give consideration to the heat dissipation performance and structural strength, and ensure the heat dissipation effect. Of course, the first cooling board 261 and the second cooling board 267 can also be made of a variety of materials with good thermal conductivity, such as copper or copper alloy.

In some embodiments, in combination with FIGS. 19-21 and 23, at least one of the first cooling boards 261 and the second cooling board 267 has at least one long slot 268, and the long slot 268 is suitable for holding a part of the heat pipe 263. The heat pipe 263 can fit multiple side walls of the long slot 268. On the one hand, it can facilitate the installation of heat pipe 263 and ensure the stability of heat pipe 263 set on two cooling boards; on the other hand, it can improve the contact area between heat pipe 263 and two cooling boards, so that it has better heat dissipation efficiency and heat dissipation effect. For example, both the first cooling board 261 and the second cooling board 267 are provided with multiple long slots 268, and the long slot 268 arranged on the first cooling board 261 and the long slot 268 arranged on the second cooling board 267 have the same slot width and are relatively arranged, so that the installation of the heat pipe 263 can be convenient.

According to an embodiment of the invention, combined with FIGS. 19, 23 and 25, each heat pipe 263 may include a first heat pipe section 264 on one side of the water cooling board 262, a second heat pipe section 265 on one side of the first cooling board 261, and a connecting pipe section 266. The distance between the second heat pipe section 265 and the force board 215 is less than the distance between the first heat pipe section 264 and the force board 215. The connecting pipe section 266 is connected between the first heat pipe section 264 and the second heat pipe section 265 to form a step structure. By setting the connecting pipe section 266, the height difference between the first heat pipe section 264 and the second heat pipe section 265 can be adapted after the first heat pipe section 264 is set on the water cooling board 262 and the second heat pipe section 265 is set on the step-down circuit module 270, which ensures the effective fit of the second heat pipe section 265 and the step-down circuit module 270, and further improves the heat dissipation effect. In addition, the connecting pipe section 266 so arranged can also facilitate the liquid of the first heat pipe section 264 to move towards the second heat pipe section 265.

In some embodiments, a thermally conductive gel capable of adjusting the height of the first cooling board 261 is provided between the step-down circuit module 270 and the first cooling board 261. For example, solder paste, soldering or interference fit can be used to install the heat pipe 263 in the long slots 268 of the two cooling boards. After the heat pipe 263 and the two cooling boards are installed into an integral structure, the second cooling board 267 of the integral structure can be fixed to the water cooling board 262 by screws. When the first cooling board 261 is installed on the step-down circuit module 270. At this time, because the components of the first cooling board 261 and the step-down circuit module 270 will have a certain height difference due to manufacturing, the first cooling board 261 and the step-down circuit module 270 are not closely attached to each other, which affects the heat dissipation efficiency. In the disclosure, by designing the connecting pipe section 266, after the second cooling board 41 is installed on the water cooling board 262, the first cooling board 261 is attached to the step-down circuit module 270 through the deformation of the connecting pipe section 266, and the deformation can reach millimeters level, for example, 1-5 mm. After adjusting the deformation of the heat pipe 263, there may be a height difference of a few tenths of a millimeter between the step-down circuit module 270 and the water-cooling plate 262, so a thermally conductive gel can be provided between the step-down circuit module 270 and the first cooling board 261.

The thermal conductive gel can be deformed under the action of force, so that the height of the first cooling board 261 can be adjusted by extruding the heat conducting gel to realize the floatable setting of the first cooling board 261 relative to the step-down module 270, so that the heat conduction gel can absorb the minor tolerances below 1 mm, which is favorable for the first cooling board 261 to be in good contact with the step-down circuit module 270, so as to achieve the purpose of heat dissipation. Of course, in other embodiments, a thermal pad can also be provided between the step-down circuit module 270 and the first cooling board 261.

According to an embodiment of the invention, the relationship between the height h of the connecting pipe section 266 and the horizontal length L of the connecting pipe section 266 meets the following requirements: $1/20 \leqslant H/L \leqslant 1/2$. Thus, the height difference between the first heat pipe section 264 and the second heat pipe section 265 is ensured, and the deformation of the connecting pipe section 266 after being stressed can be realized, thereby ensuring the installation of the first cooling board 261 on the step-down circuit module 270.

In some embodiments, as shown in FIG. 25, the first heat pipe section 264 and the connecting pipe section 266, the second heat pipe section 265 and the connecting pipe section 266 are arc-shaped transition, and the arc radius is greater than or equal to twice the diameter of the heat pipe 263. In this way, the structural reliability of the heat pipe 263 can be further improved.

Figure 21:
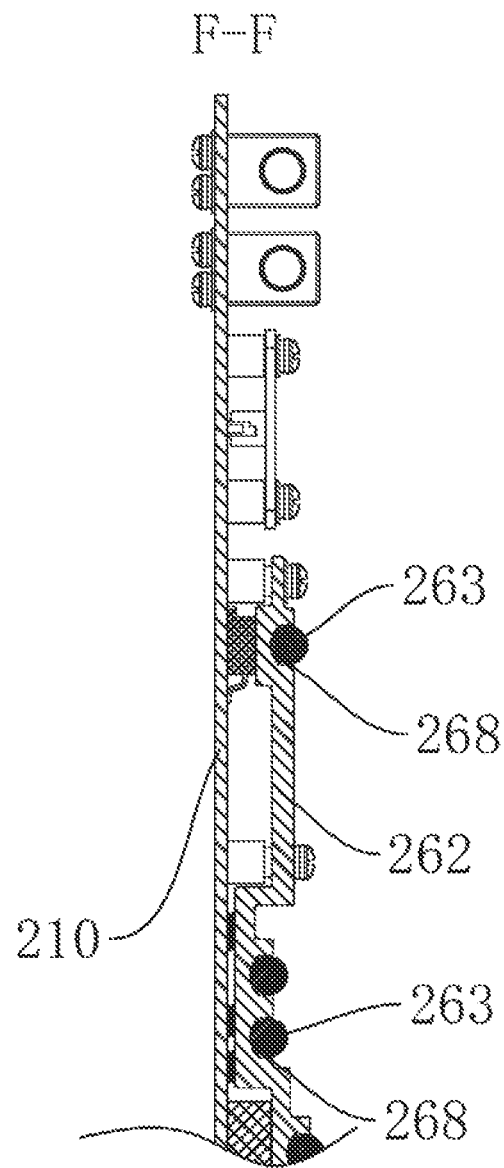
FIG. 21 is a sectional view at F-F of FIG. 19.

Combined with FIG. 21 and FIG. 25, multiple heat pipes 263 can be adjusted according to the structure shape of heat source. In the parallel direction of multiple heat pipes 263, the first cooling board 261 can be set to different heights, which can make the second pipe section of multiple heat pipes 263 have different heights, and then the heat source setting can be more fitted to improve the heat dissipation efficiency and heat dissipation effect.

It is necessary to note that the greater the temperature difference between the two ends of the heat pipe 263 is, the more conducive to the rapid heat conduction at both ends, and then to improve the heat dissipation efficiency and heat dissipation effect of heat source. The internal pipes of the water cooling board 262 can be arranged in snake shape. At least a part of the pipes can be set relative to the first heat pipe section 264 or the second cooling board 267, which can make the water cooling board 262 heat dissipation the first heat pipe section 264, so as to improve the heat dissipation efficiency and effect of the heat pipe 263.

Figure 20:
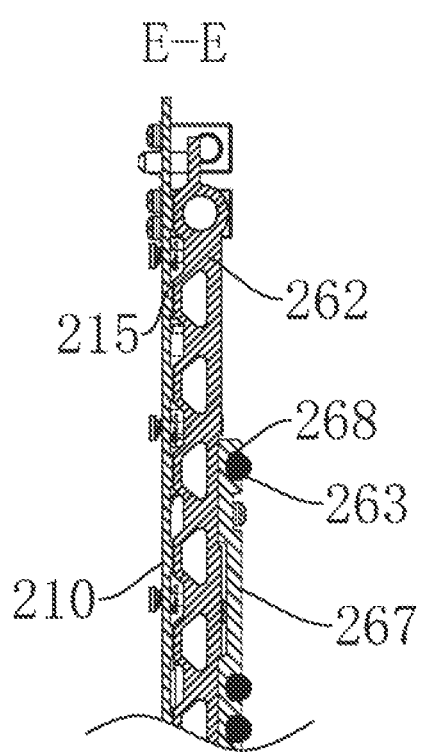
FIG. 20 is a sectional view at E-E of FIG. 19.

According to FIG. 20, the cross section of the pipe can be an isosceles trapezoid. The two bottom edges of the trapezoid can be respectively arranged towards the hash chip 218 and the second cooling board 267, so that the opposite surfaces of the pipe and the force chip 218 and the second cooling board 267 are in a straight line shape. In this way, compared with the circular, square, triangular and other sections, the water cooling board 262 is convenient to reduce the distance between the internal pipe and the force chip 218, the internal pipe and the first heat pipe section 264, and the trapezoidal structure has large contact area and flow area, which is conducive to the uniform temperature heat dissipation of the water cooling board 262, and can reduce the flow resistance, so as to improve the heat dissipation efficiency and heat dissipation effect. And the temperature of the first heat pipe section 264 can be effectively reduced to improve the temperature difference between the two ends of the heat pipe 263. For example, the bottom edge of the long cross section of the pipeline can be set towards the first heat pipe section 264, so that the area of the opposite surface of the pipeline towards the first heat pipe section 264 is larger, so that the temperature of the first heat pipe section 264 can be further reduced, and the heat dissipation efficiency and effect of the heat pipe 263 on the heat source can be improved. In addition, the thickness of the water cooling board 262 can be reduced. In addition, the bottom edge of the trapezoid and the waist line can be arc-shaped transition, so as to facilitate the flow of liquid in the pipeline.

In the embodiment of FIG. 26, the hash board 210 can also be provided with a baffle 216 and a handle 217. A plurality of baffles 216 are arranged at one end of the hash board 215 away from the step-down circuit module 270. A plurality of hash boards 210 are arranged in the accommodation space of the housing 230. The baffle 216 closes the opening of the accommodation space, and the hand 217 is arranged at the side of the baffle 216 away from the electrical connection board. The hash board 210 can be slidably arranged in the accommodation space, and the handle 217 can be pulled or pushed to facilitate the hash board 210 to be arranged or separated from the accommodation space.

Figure 29:
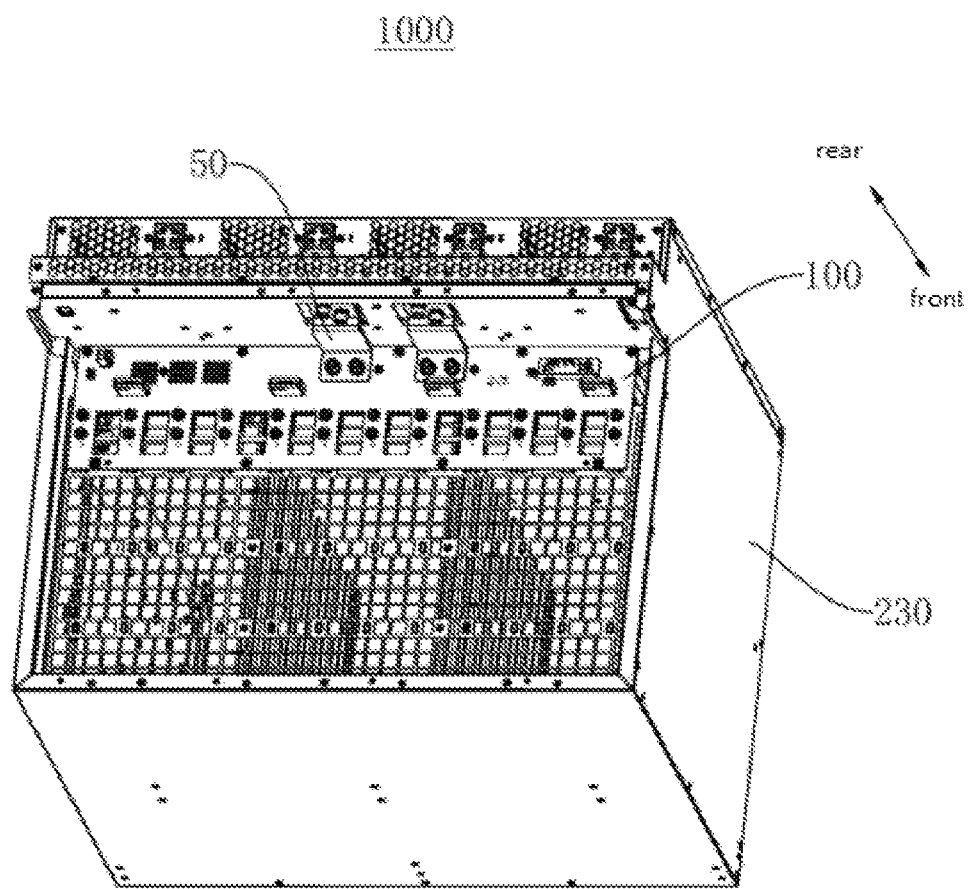
FIG. 29 is a sixth angle of schematic view of a server according to an embodiment of the disclosure.

According to FIG. 1-FIG. 2 and combining with FIG. 29, the server 1000 can include 12 hash boards 210, which can be air-cooled hash boards, and the electrical connection board 100 can be provided with 12 pairs of conductive pins 71 and supply power to the 12 hash boards 210 at the same time, so that there is no need to set wires, so as to ensure the cleanness and easy disassembly of the server 1000, and the computing power of the server 1000 is large. Combined with FIG. 18 and FIG. 29, the electrical connection board 100 can be provided with interfaces for electrical connection with the control module 240 and the power supply module 250 respectively. At the same time, the server can include 12 liquid cooling power calculation boards, and the electrical connection board 100 can be provided with 12 pairs of conductive pins 71, so that the electrical connection board 100 can supply power for 12 hash boards at the same time, so that there is no need to set wires and ensure that the server 1000 clean and easy to disassemble. At the same time, the computing power of server 1000 is large.

Figure 30:
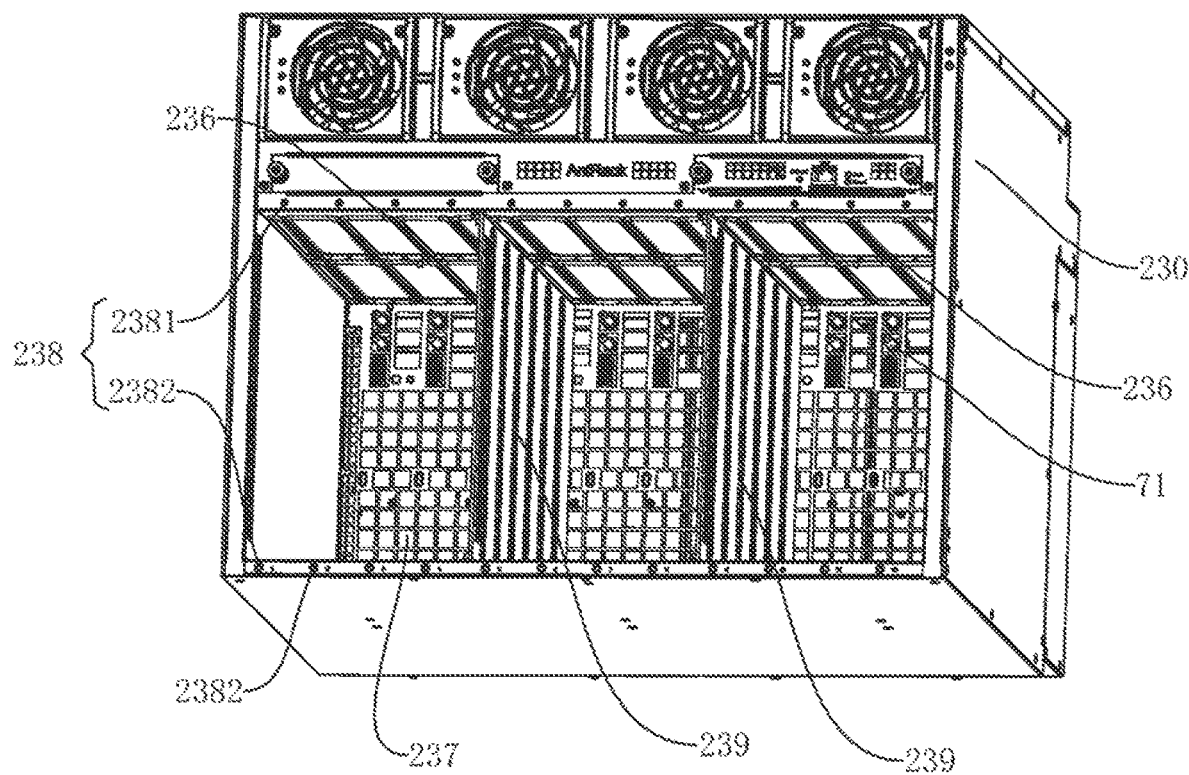
FIG. 30 is a seventh angle of schematic view of a server according to an embodiment of the disclosure.
Figure 31:
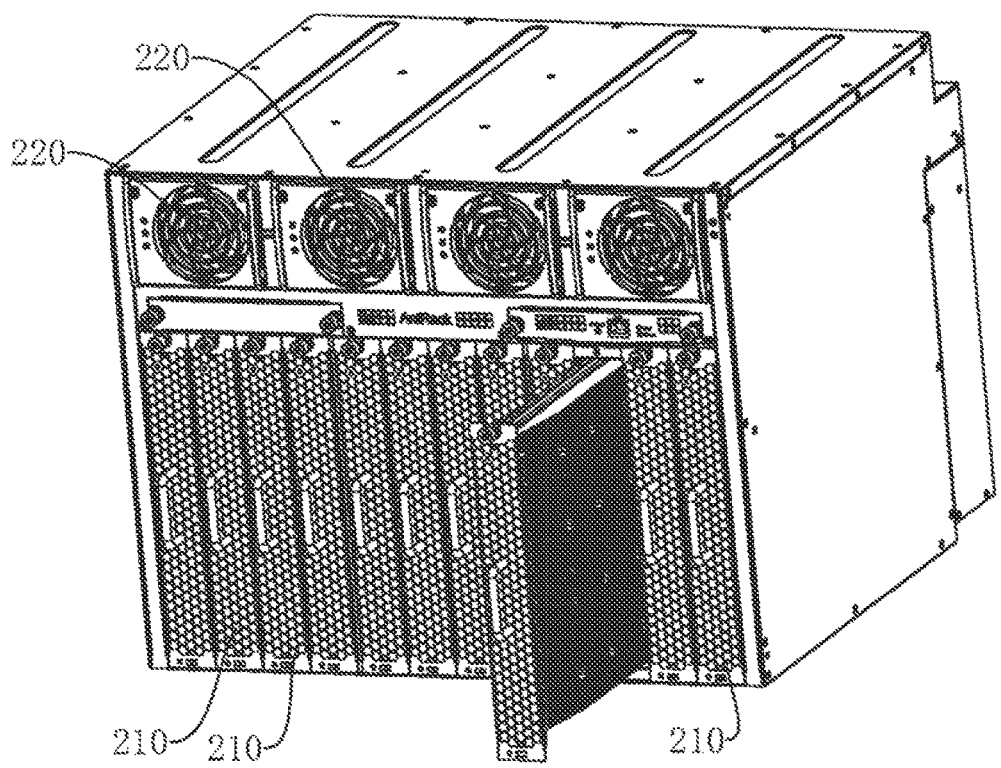
FIG. 31 is an eighth angle of schematic view of a server according to an embodiment of the disclosure.
Figure 32:
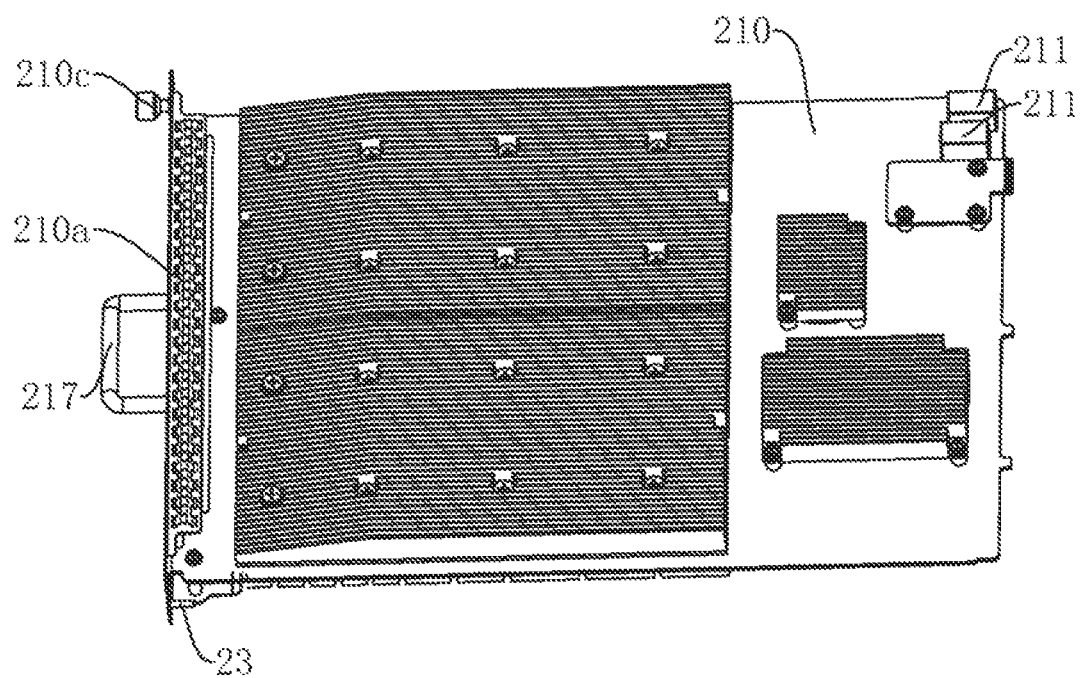
FIG. 32 is a sixth angle of schematic view of a hash board according to an embodiment of the disclosure.

In some embodiments, as shown in FIGS. 30-32, a chute 236 may be provided in the first accommodation space 231. The sliding chute 236 is distributed at the top and bottom of the first accommodation space 231, and the housing 230 also forms an open side 237 connected with the first accommodation space 231. The open side 237 is located at the front side of the housing 230 which is provided with a fixing part 238 at the edge of the open side 237, and the hash board 210 can be slidably arranged on the chute 236, The top edge and bottom edge of the hash board 210 are matched in the chutes 236 of the top and bottom of the first accommodation space 231, respectively. Here "top" refers to the upper end as shown in FIG. 1, and "bottom" refers to the lower end as shown in FIG. 1. One end of the hash board 210 (for example, the front end shown in FIG. 1) is provided with a plug-in part 210a, which can be detachable mounted on the fixing part 238 and at least partially sealing the open side 237 of the cover.

The chutes 236 can guide the hash board 210 on the one hand, and can realize the accurate installation and fixation of the hash board 210, which can reduce the difficulty of installation and fixation. On the other hand, it can facilitate the sliding setting of the hash board 210 and the housing 230. The friction between the force board 210 so arranged and the chutes 236 is relatively small, which can make the force saving when the hash board 210 is taken out of the first accommodation space 231.

By installing the plug-in part 210a on the fixing part 238, the installation and fixation of the hash board 210 in the first accommodation space 231 on the housing 230 can be realized. The cooperation of the plug-in part 210a and the fixing part 238 can further improve the installation stability and firmness of the hash board 210 in the first accommodation space 231. In addition, the plug-in part 210a at least partially covers the open side 237, In this way, the open side 237 of the first accommodation space 231 can be covered; the hash board 210 can be placed in the relatively closed first accommodation space 231; the hash board 210 can be protected; the external matters can be prevented from entering the first accommodation space 231 and damaging the hash board 210; the structural reliability of the hash board 210 can be improved, and the service life of the server 1000 can be improved.

Thus, by sliding the hash board 210 on the chute 236 and detachably installing the plug-in part 210a on the fixing part 238, the hash board 210 can be detachably arranged in the first accommodation space 231 of the housing 230, which can not only reduce the difficulty of installing or disassembling the power calculation board 210. Moreover, the installation and disassembly of the single hash board 210 in the first accommodation space 231 of the housing 230 can be realized, and the interference between the two can be avoided, thus facilitating the disassembly and installation of the single hash board 210. When a single hash board 210 needs to be replaced or repaired, only a single hash board 210 can be removed, so that the normal operation of other hash boards 210 will not be affected, the work efficiency of server 1000 can be ensured, and the structure of server 1000 can be optimized.

In some embodiments, the fixing part 238 may include a fixing hole 2381 located at one edge of the open side 237 and a positioning hole 2382 located at the other edge of the open side 237, and the plug-in part 210a may be fixed at the fixing hole 2381 by the fastener 210c. The fixing hole 2381 and the positioning hole 2382 may be multiple.

The fastener 210c can be a hand screw, and the fixing hole 2381 can be a threaded hole. The screw passes through the plug-in part 210a, which is matched with the threaded hole on the edge of the open side 237 by external force, and the plug-in part 210a is fixed on the edge of the open side 237 by threaded connection. Because the plug-in part 210a is connected with the hash board 210 to form the hash board 210. Thus, the installation and fixation of the hash board 210 can be realized, and the installation stability and firmness of the hash board 210 can be improved. The fastener 210c is set as a hand screw, which can be directly screwed by hand when the plug-in part 210a is installed or removed, without the use of other auxiliary devices, so as to further reduce the difficulty of the installation or removal of the hash board 210, and improve the removal efficiency.

The plug-in part 210a can be provided with a positioning pin 210b which fits in the positioning hole 2382. The positioning pin 210b is inserted into the positioning hole 2382 and is connected and fixed, so as to further install the hash board 210 in the first accommodation space 231, which can further improve the installation stability and firmness of the hash board 210.

The fixing part 238 can be arranged on the upper and lower edges of the open side 237. In other words, when the fixing hole 2381 is set at the upper edge of the open side 237, the positioning hole 2382 can be set at the lower edge of the open side 237; when the fixing hole 2381 is set at the lower edge of the open side 237, the positioning hole 2382 can be set at the upper edge of the open side 237. In this way, the force on the upper and lower sides of the hash board 210 can be more uniform, and the installation and fixation of the hash board 210 can be more stable and firm. In addition, through the combination of positioning and fixation, the installation mode of plug-in part 210*a* can be simple and convenient; the fixation is reliable; the number of fasteners 210*c* can be reduced, and the difficulty of disassembly can be reduced.

In combination with FIG. 30 and FIG. 31, the baffle 28 can cover the open side 237 of the first accommodation space 231, so that the first accommodation space 231 can be further sealed, so that the first accommodation space 231 is in a relatively closed state, thereby preventing external foreign matters from entering the first accommodation space 231 and damaging the hash board 210, which can improve the service life of the hash board 210. Furthermore, the handle 29 is arranged on the side where the baffle 28 is far away from the hash board 210, so that the handle 29, the baffle 28 and the hash board 210 can be connected and fixed with each other in turn to form a part of the hash board 210, so that the hash board 210 can be easily plugged in and out by applying appropriate force to the handle 29. In addition, the baffle 28 can be detachably installed on the fixing part 238, The handle 29 can facilitate the user to apply external force to the hash board 210, which can make the structural design of the server 1000 more ingenious and improve the user's experience.

The matching setting of the hash board 210 and the chute 236 has a pre guiding effect on the hash board 210. The setting of the conductive pin 71 and the mounting seat 211 realizes the accurate guidance when installing the hash board 210. A variety of guiding matching can improve the installation efficiency and stability of the hash board 210, thus omitting the setting of multiple screws and setting the screws as hand screws, The server 1000 can be disassembled without external force, and the installation reliability of multiple modules can be ensured. The first mock exam is that any installation method can be applied to any module, and is not mentioned here.

As shown in FIG. 1 and FIG. 30, the first accommodation spaces 231 may be multiple, and there are two adjacent accommodation spaces 231. A partition 239 extending along a first direction (for example, the front and rear direction as shown in FIG. 1) is arranged. The partition 239 can make each first accommodation space 231 independent of each other. The partition 239 can be made of materials with good heat dissipation and flame retardant, which can not only further reduce the temperature of the hash board 210, but also improve the reliability of the hash board 210. When the temperature of the hash board 210 in one first accommodation space 231 is too high, it can be prevented from affecting the hash board 210 in another first accommodation space 231, thereby improving the reliability of the server 1000.

In the description of the disclosure, it should be understood that the orientation or position relationship indicated by the terms "center", "length", "width", "thickness", "up", "down", "bottom", "front", "back", "left", "right", "inside" and "outside" is seated on the orientation or position relationship shown in the figures, only for the convenience of describing the disclosure and simplifying the description, not to indicate or imply that the device or element must have a specific orientation, be constructed and operated in a specific orientation, and it cannot be understood as a limitation to the disclosure.

In the description of the disclosure, "plurality" means two or more.

Other components of the server 1000 according to the embodiments of the disclosure, such as inductance module and MOS tube, and the operation are known to those skilled in the art, and will not be described in detail here.

In the description of this specification, reference is made to the description of the terms "one embodiment", "some embodiments", "illustrative embodiments", "examples", "specific examples", or "some examples", etc., meaning that the specific features, structures, materials, or features described in connection with the embodiment or example are included in at least one embodiment or example of the present invention. In this specification, the schematic expression of the above terms does not necessarily refer to the same embodiment or example.

Although the embodiments of the disclosure have been shown and described those of ordinary skill in the art can understand that a variety of changes, modifications, substitutions, and variants can be made to these embodiments without departing from the principle and purpose of the disclosure, and the scope of the disclosure is defined by the claims and their equivalents.

The ivention claimed is:

1. A server, comprising:
   a housing configured as a frame structure, and configured with at least a first accommodation space, a second accommodation space for accommodating a power module, a third accommodation space located between the first accommodation space and the second accommodation space and a fourth accommodation space located between the first accommodation space and the second accommodation space;
   a plurality of hash boards arranged in the first accommodation space of the housing side by side along a first direction;
   a control module slidably arranged in the third accommodation space of the housing;
   a power supply module slidably arranged in the fourth accommodation space of the housing;
   an electrical connection board arranged in the housing, and being configured to respectively connect to the hash board, the power module, the control module, and the power supply module;
   a heat dissipation module at least dissipating heat for the plurality of hash boards;
   wherein each of the hash boards is arranged perpendicular to the first direction and is slidably arranged in the first accommodation space, and the fourth accommodation space is separated from the third accommodation space in the first direction; the power module supplies power to the hash board through the electric connection board, and the power supply module supplies power to the control module through the electric connection board;
   wherein the hash board comprises:
   a hash board body, on which a hash chip is arranged; and
   a baffle board arranged at one end of the hash board body opposite to the electrical connection board, and the baffle board is configured to close the opening of the first accommodation space after the hash board is contained in the first accommodation space; and
   a handle arranged on the side of the baffle opposite to the electrical connecting board.

2. The server according to claim 1, wherein the hash board is provided with a step-down circuit module, wherein the power module is configured to convert a first AC power voltage of a first external AC power to a DC power and supply the DC power to the step-down circuit module, wherein the step-down circuit module reduces a DC power voltage and supplies power to the hash chip on the hash board.

3. The server according to claim 2, wherein the first DC power voltage of the DC power converted by the power module is 48V, and a second DC power voltage of the DC power reduced by the step-down circuit module of the hash board is 12V.

4. The server according to claim 2, wherein the power supply module converts the second AC power voltage of the external second AC power into a third DC power voltage of 12V to supply power to the control module.

5. The server according to claim 1, wherein the control module comprises a control board body and a first circuit board arranged at one end of the control board body; the first circuit board is provided with a first control signal interface and a second control signal interface; the first control signal interface is suitable for connecting with a first port of the electrical connection board to realize signal connection, and the second control signal interface is suitable for connecting with a second port of the electrical connection board to transmit the current; and
  both sides of the third accommodation space are provided with sliding strips, and the control board body is provided with slideways on both sides, wherein the control board body realizes the movement in the third accommodation space by sliding the sliding strips in the slideways.

6. The server according to claim 5, wherein the power supply module comprises:
  a power supply board body; and
  a second circuit board arranged at one end of the power supply board body; the second circuit board is provided with a first current interface and a second current interface, wherein the first current interface is suitable for connecting with a third port of the electrical connection board to access the external voltage, and the second current interface is suitable for connecting with a fourth port of the electrical connection board to transmit the current.

7. The server according to claim 1, wherein the electrical connection board comprises:
  a PCB substrate provided with two contact areas respectively connected with positive and negative electrodes of the power supply, and the two sides of each contact area provided with first and second contact surfaces suitable for contacting with the conductor, and each contact area provided with multiple through holes;
  a first conductive layer and a second conductive layer respectively arranged on the first and the second contact surfaces;
  a third conductive layer arranged in the through hole and electrically connecting the first and second conductive layers;
  a first conductive strip fixed to the first conductive layer and electrically connecting with the first conductive layer, wherein the first conductive strip is suitable for connecting the power module;
  a second conductive strip electrically connecting to the second conductive layer and electrically connecting with the second conductive layer, wherein the second conductive strip is electrically connected with the hash board.

8. The server according to claim 7, wherein the PCB substrate is also provided with screw holes, and the first conductive strip, the second conductive strip and the PCB substrate are connected by screws, wherein the multiple through holes are arranged around the screw holes, and the diameter ratio of the through holes to the screw holes ranges from 1/10 to 1/100.

9. The server according to claim 7, wherein the first conductive strip comprises:
  a first conductive sheet connecting with the first conductive layer;
  a second conductive sheet connecting with the power module, and
  a connecting sheet connecting between the first conductive sheet and the second conductive sheet.

10. The server according to claim 7, wherein the electrical connection board further comprises:
  two conductive connection boards respectively connecting with the second conductive strips of the two contact areas to connect the positive and negative electrodes of the power supply, wherein each conductive connection board is provided with a plurality of conductive pins, and the conductive pins on the two conductive connecting boards are one-to-one corresponding to form a plurality of pairs of conductive pins, wherein each pair of conductive pins is one-to-one corresponding to each hash board and electrically connected to supply power to the bash board;
  an insulating layer arranged between the two conductive connection boards to avoid short circuit between the conductive connection boards connecting the positive and the negative electrodes of the power supply.

11. The server according to claim 10, wherein the two conductive connection boards are parallel in the length direction of the PCB substrate, and are separated by a preset gap in the height direction of the PCB substrate, wherein the plurality of conductive pins are arranged evenly at intervals in the length direction of each conductive connection board;
  the insulating layer arranged at the positive electrode of the conductive connection board.

12. The server according to claim 1, wherein chutes are arranged in the first accommodation space, and the chutes are distributed at the top and bottom of the first accommodation space, wherein the housing is also formed with an open side connected with the first accommodation space, and the housing is provided with a fixed part at the edge of the open side;
  the hash board is slidably arranged on the chutes, the top edge and the bottom edge of the hash board are respectively matched in the chutes at the top and the bottom of the first accommodation space, wherein one end of the hash board is provided with a plug-in part, which is detachably installed on the fixed part and at least partially covers the open side.

13. The server according to claim 12, wherein the fixing part comprises a fixing hole at one edge of the open side and a positioning hole at the other edge of the open side, wherein the plug-in part is fixed at the fixing hole through a fastener and is provided with a positioning pin, and the positioning pin fits in the positioning hole;
  the first accommodation spaces are multiple, and a partition board extending along the first direction is arranged between adjacent first accommodation spaces.

14. The server according to claim 1, wherein the hash board body further comprises a heat sink for dissipating heat of the hash chip, and the hash board is provided in the first accommodation space of the housing and slide towards the front side of the housing, wherein the heat dissipation module is arranged at the rear end of the housing and corresponds to the hash board, and the heat dissipation module comprises at least one fan to dissipate heat for the hash board.

15. The server according to claim 1, wherein the hash board further comprises a step-down circuit module arranged on the hash board body and separated from the hash chip in a second direction, wherein the second direction is parallel to the extension direction of the hash board;
the heat dissipation module comprising:
at least one first cooling board arranged on the step-down circuit module;
a water cooling board arranged on one side surface of the hash board body;
at least one heat pipe arranged on the hash board body, and one end of the heat pipe is lapped on the first cooling board and the other end is lapped on the water cooling board.

16. The server according to claim 15, wherein the first cooling board comprises a plurality of first cooling boards spaced apart on the step-down circuit module, and each first cooling board corresponds to at least one heat pipe.

17. The server according to claim 15, wherein each of the heat pipes comprises:
a first heat pipe section lapped on one side of the water cooling board;
a second heat pipe section lapped on one side of the first cooling board, and the distance between the second heat pipe section and the hash board body is less than the distance between the first heat pipe section and the bash board body;
a connecting pipe section connected between the first heat pipe section and the second heat pipe section to form a step structure.

18. The server according to claim 17, wherein the relationship between the height h of the connecting pipe section and the horizontal length L of the connecting pipe section meets the following requirements:

$$1/20 \leq h/L \leq 1/2.$$

19. The server according to claim 17, wherein arc transitions are provided between the first heat pipe section and the connecting pipe section, and between the second heat pipe section and the connecting pipe section, and the radius of the arc is greater than or equal to twice the diameter of the heat pipe.

* * * * *